(12) United States Patent
Nishimura

(10) Patent No.: US 10,985,083 B2
(45) Date of Patent: Apr. 20, 2021

(54) SEMICONDUCTOR DEVICE AND METHOD FOR MANUFACTURING THE SAME

(71) Applicant: Rohm Co., Ltd., Kyoto (JP)

(72) Inventor: Isamu Nishimura, Kyoto (JP)

(73) Assignee: ROHM CO., LTD, Kyoto (JP)

( * ) Notice: Subject to any disclaimer, the term of this patent is extended or adjusted under 35 U.S.C. 154(b) by 0 days.

(21) Appl. No.: 16/269,816

(22) Filed: Feb. 7, 2019

(65) Prior Publication Data
US 2019/0252290 A1 Aug. 15, 2019

(30) Foreign Application Priority Data
Feb. 13, 2018 (JP) .............................. JP2018-022848

(51) Int. Cl.
| H01L 23/49 | (2006.01) |
| H01L 21/56 | (2006.01) |
| H01L 23/373 | (2006.01) |
| H01L 23/31 | (2006.01) |
| H01L 21/288 | (2006.01) |
| H01L 23/498 | (2006.01) |

(52) U.S. Cl.
CPC ........ *H01L 23/3735* (2013.01); *H01L 21/288* (2013.01); *H01L 21/56* (2013.01); *H01L 23/3121* (2013.01); *H01L 23/3157* (2013.01); *H01L 23/49838* (2013.01); *H01L 23/49866* (2013.01)

(58) Field of Classification Search
CPC ... H01L 23/3735; H01L 21/288; H01L 21/56; H01L 23/3121; H01L 23/3157
USPC ........................................................ 257/773
See application file for complete search history.

(56) References Cited

U.S. PATENT DOCUMENTS

| 2002/0053720 A1* | 5/2002 | Boursat ................. H01L 23/147 257/640 |
| 2006/0001055 A1* | 1/2006 | Ueno ..................... H01L 33/486 257/257 |
| 2006/0214291 A1* | 9/2006 | Sasaki ................... H01L 23/051 257/734 |
| 2010/0314773 A1* | 12/2010 | Kobayashi .............. H01L 21/50 257/773 |
| 2011/0012265 A1* | 1/2011 | Egawa ............. H01L 23/49838 257/773 |
| 2011/0309512 A1* | 12/2011 | Gejima .................. H01L 24/32 257/771 |

(Continued)

FOREIGN PATENT DOCUMENTS

JP 2005-277380 A 10/2005

*Primary Examiner* — Sheikh Maruf
(74) *Attorney, Agent, or Firm* — Hamre, Schumann, Mueller & Larson, P.C.

(57) ABSTRACT

A semiconductor device includes a semiconductor element, a wiring portion, an electrode pad, a sealing resin and a heat dissipation layer. The semiconductor element has a front surface and a back surface opposite to the front surface in a thickness direction of the semiconductor device. The wiring portion is electrically connected to the semiconductor element. The electrode pad is electrically connected to the wiring portion. The sealing resin covers the semiconductor element. The heat dissipation layer is held in contact with the back surface of the semiconductor element and exposed from the sealing resin. The semiconductor element overlaps with the first heat dissipation layer as viewed in the thickness direction.

14 Claims, 21 Drawing Sheets

(56) References Cited

U.S. PATENT DOCUMENTS

| | | | | |
|---|---|---|---|---|
| 2012/0228757 A1* | 9/2012 | Kitami | F28D 15/0266 | 257/713 |
| 2013/0062745 A1* | 3/2013 | Kimura | H01L 23/293 | 257/675 |
| 2014/0124915 A1* | 5/2014 | Hayashi | H01L 25/18 | 257/713 |
| 2014/0159054 A1* | 6/2014 | Otake | H01L 25/072 | 257/77 |
| 2015/0179551 A1* | 6/2015 | Nakamura | H01L 29/408 | 257/773 |
| 2015/0187726 A1* | 7/2015 | Park | H01L 25/072 | 257/666 |
| 2015/0214142 A1* | 7/2015 | Kariyazaki | H05K 1/0253 | 257/774 |
| 2015/0257252 A1* | 9/2015 | Kato | H01L 23/3735 | 257/773 |
| 2015/0262906 A1* | 9/2015 | Kim | H01L 23/3736 | 257/773 |
| 2015/0287665 A1* | 10/2015 | Hanada | H01L 23/482 | 257/691 |
| 2015/0340350 A1* | 11/2015 | Koga | H01L 23/49531 | 257/713 |
| 2015/0371915 A1* | 12/2015 | Hashimoto | H01L 23/562 | 257/531 |
| 2016/0005670 A1* | 1/2016 | Iizuka | H01L 23/3675 | 257/693 |
| 2016/0027709 A1* | 1/2016 | Okamoto | H01L 23/045 | 257/693 |
| 2016/0049378 A1* | 2/2016 | Song | H01L 24/17 | 257/712 |
| 2016/0148865 A1* | 5/2016 | Naoe | C04B 37/00 | 257/773 |
| 2016/0181173 A1* | 6/2016 | Clevenger | H01L 23/367 | 257/773 |
| 2016/0254250 A1* | 9/2016 | Ikeda | H01L 24/40 | 257/773 |
| 2016/0294379 A1* | 10/2016 | Hayashiguchi | H03K 17/122 | |
| 2016/0315023 A1* | 10/2016 | Yoshida | H05K 1/0209 | |
| 2016/0343590 A1* | 11/2016 | Yoshihara | H01L 23/49811 | |
| 2017/0271274 A1* | 9/2017 | Hinata | H01L 23/562 | |
| 2018/0308833 A1* | 10/2018 | Sasaki | H01L 23/3735 | |
| 2018/0350710 A1* | 12/2018 | Iwahashi | H01L 25/115 | |
| 2019/0004571 A1* | 1/2019 | Sahu | H01L 23/147 | |
| 2019/0035770 A1* | 1/2019 | Iguchi | H01L 24/40 | |
| 2019/0164865 A1* | 5/2019 | Eiger | H01L 23/315 | |

* cited by examiner

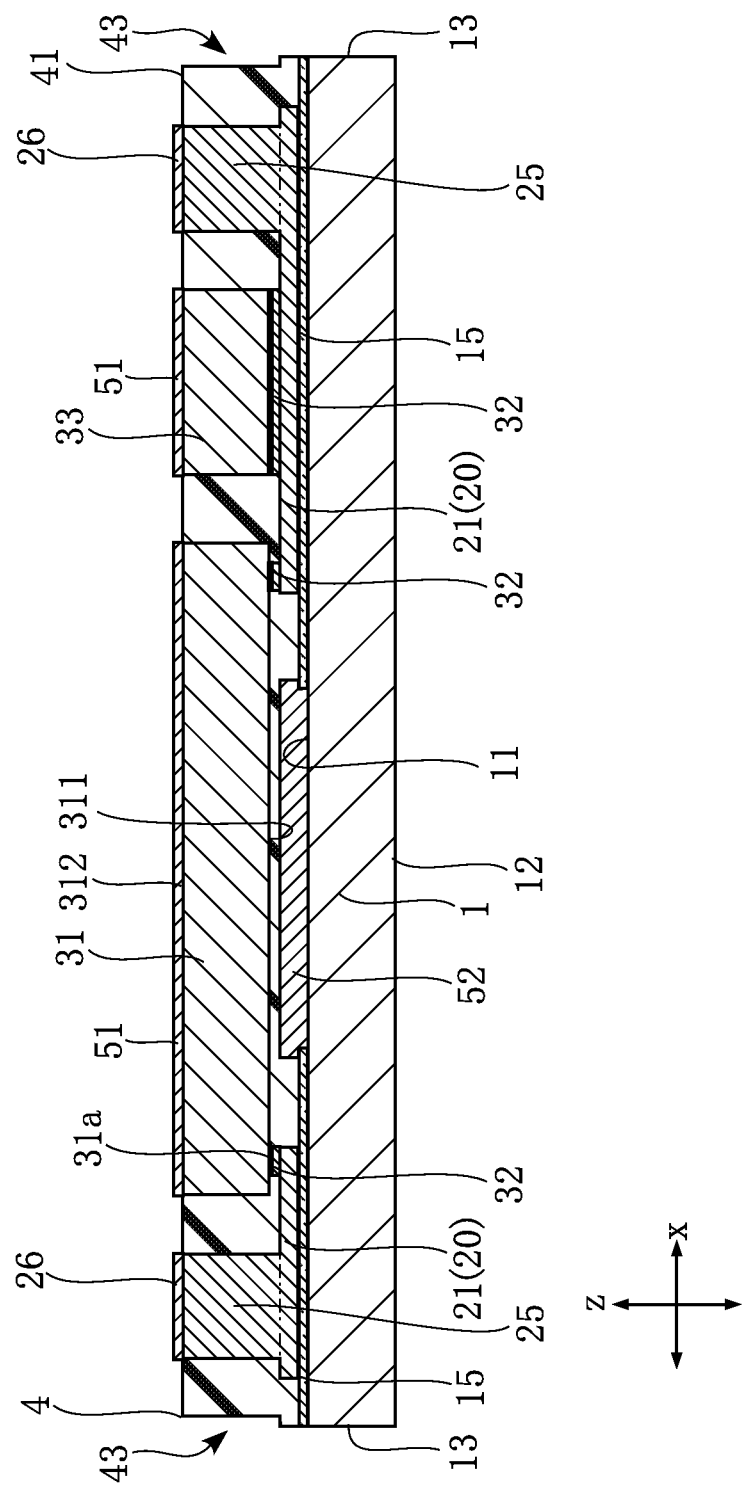

SEMICONDUCTOR DEVICE AND METHOD FOR MANUFACTURING THE SAME

FIELD

The present disclosure relates to a semiconductor device including a semiconductor element, and a method for manufacturing such a semiconductor device.

BACKGROUND

Micromachines or MEMS, developed by the application of LSI fabrication technologies, are widely used to provide devices incorporating various semiconductor elements on a finely machined Si substrate (silicon wafer). Fabrication of micromachines may involve anisotropic etching using an alkaline solution. Anisotropic etching accurately forms fine recesses in a Si substrate for housing semiconductor elements.

JP-A-2005-277380 discloses a semiconductor device (packaged LED) that can be made by utilizing micromachine fabrication techniques. The semiconductor device disclosed in this document has a Si substrate formed with a recess having a bottom surface and a side surface. An LED chip is mounted on the bottom surface of the recess to be received in the recess. The bottom surface and side surface of the recess is formed with an electrode electrically connected to the LED chip. The electrode is made by forming a Ti layer and a Cu layer by sputtering, for example, on the Si substrate including the recess, and then patterning the layers by photolithography and etching. After the electrode is formed, the LED chip is mounted on the bottom surface of the recess and then the recess is filled with a sealing resin, whereby the semiconductor device is completed.

In the semiconductor device disclosed in this document, the LED chip is covered with the sealing resin, which has a lower thermal conductivity than that of the Si substrate. Thus, if a semiconductor element that generates a relatively large amount of heat is mounted instead of the LED chip, heat from the semiconductor element may not be sufficiently dissipated to the outside.

SUMMARY

The present disclosure has been proposed under the above-noted circumstances, and an object of the disclosure is to provide a semiconductor device capable of efficiently dissipating heat from the semiconductor element to the outside, and a method for manufacturing such a semiconductor device.

According to a first aspect of the present disclosure, there is provided a semiconductor device provided with: a semiconductor element including an element front surface and an element back surface that are opposite to each other in a thickness direction; a wiring portion electrically connected to the semiconductor element; an electrode pad electrically connected to the wiring portion; a sealing resin that covers a portion of the semiconductor element; and a first heat dissipation layer that is held in contact with the element back surface and exposed from the sealing resin. The semiconductor element overlaps with the first heat dissipation layer as viewed in the thickness direction.

According to a second aspect of the present disclosure, there is provided a method for manufacturing a semiconductor device. By the method, the following may be performed. A wiring portion is formed on a semiconductor substrate. A semiconductor element is electrically connected to the wiring portion, wherein the semiconductor element has an element front surface and an element back surface, with the element front surface facing the semiconductor substrate. A sealing resin is formed to cover the semiconductor element. A portion of the sealing resin is removed to expose the element back surface. A first heat dissipation layer is formed to be in contact with the element back surface. An electrode pad is formed to be electrically connected to the wiring portion.

The semiconductor device according to the present disclosure efficiently dissipates heat from the semiconductor element to the outside.

Other features and advantages of the present disclosure will become apparent from the detailed description given below with reference to the accompanying drawings.

DRAWINGS

FIG. 38 is a sectional view of a semiconductor device according to a variation.

EMBODIMENTS

Figure 1:
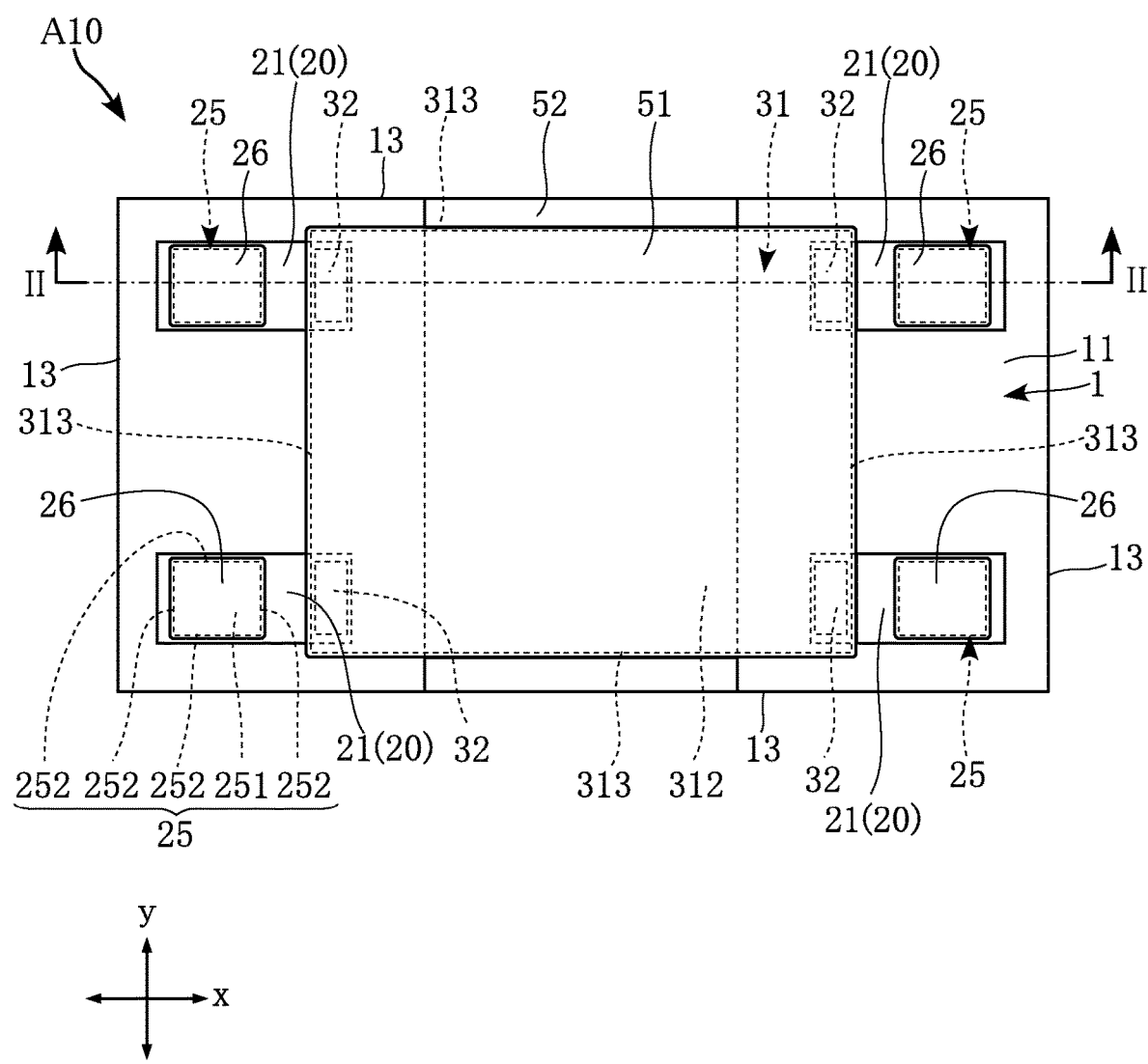
FIG. 1 is a plan view of a semiconductor device according to a first embodiment.

Preferred embodiments of a semiconductor device and a method for manufacturing the semiconductor device according to the present disclosure are described below with reference to the accompanying drawings.

A semiconductor device A10 according to a first embodiment is described with reference to FIGS. 1-4. The semiconductor device A10 includes a substrate 1, an insulating layer 15, a wiring portion 20, columnar portions 25, electrode pads 26, a semiconductor element 31, bonding layers 32, a sealing resin 4, a first heat dissipation layer 51, and a second heat dissipation layer 52.

Figure 2:
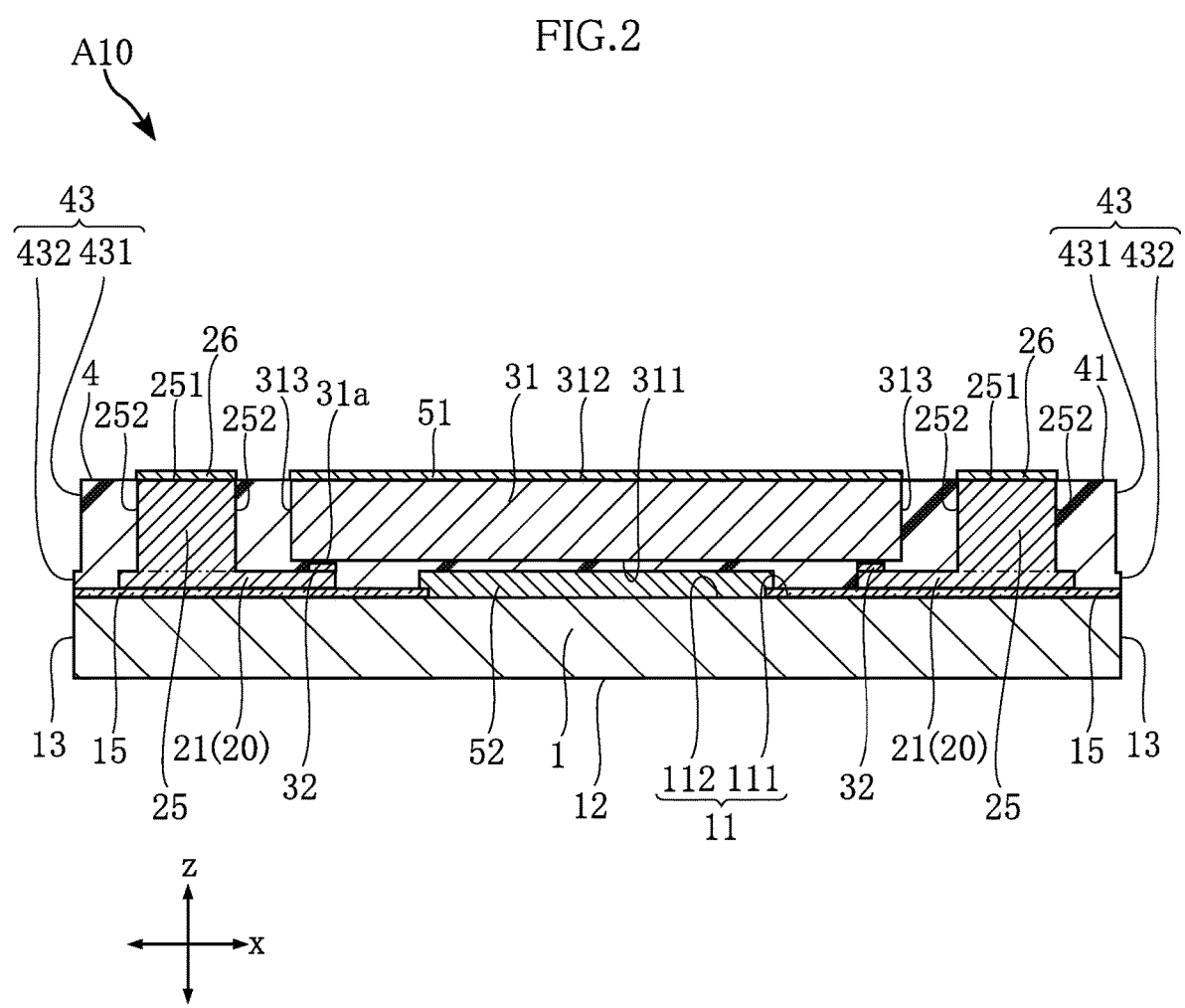
FIG. 2 is a sectional view taken along line II-II in FIG. 1.
Figure 3:
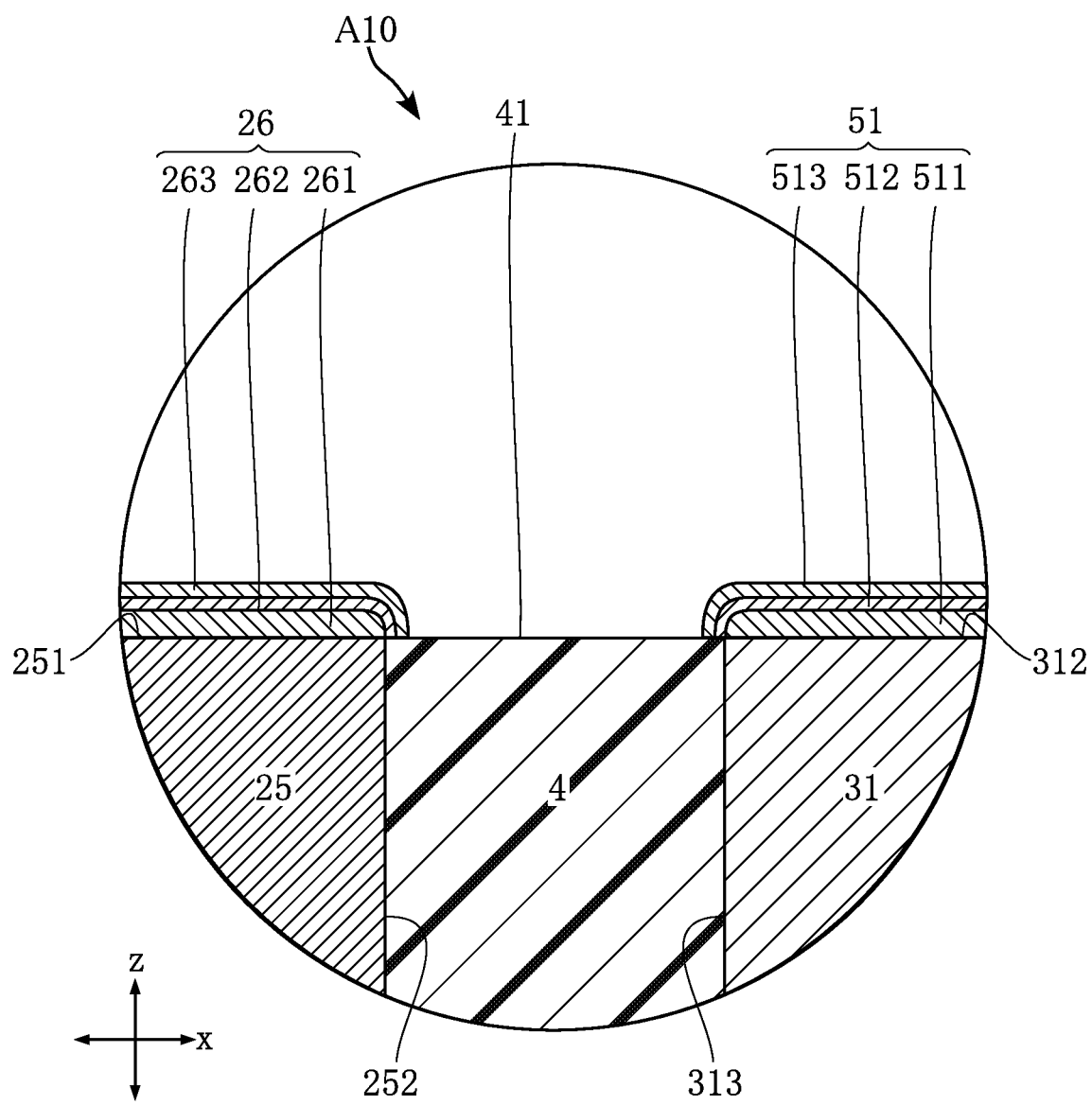
FIG. 3 is a sectional view showing a part of FIG. 2 as enlarged.

FIG. 1 is a plan view of the semiconductor device A10. Note that illustration of the sealing resin 4 and insulating layer 15 is omitted in FIG. 1 for easier understanding. FIG. 2 is a sectional view taken along line II-II in FIG. 1. FIG. 3 is a sectional view showing a part of FIG. 2 as enlarged. Specifically, FIG. 3 shows the cross sectional configuration of the electrode pad 26 and the first heat dissipation layer 51.

Figure 4:
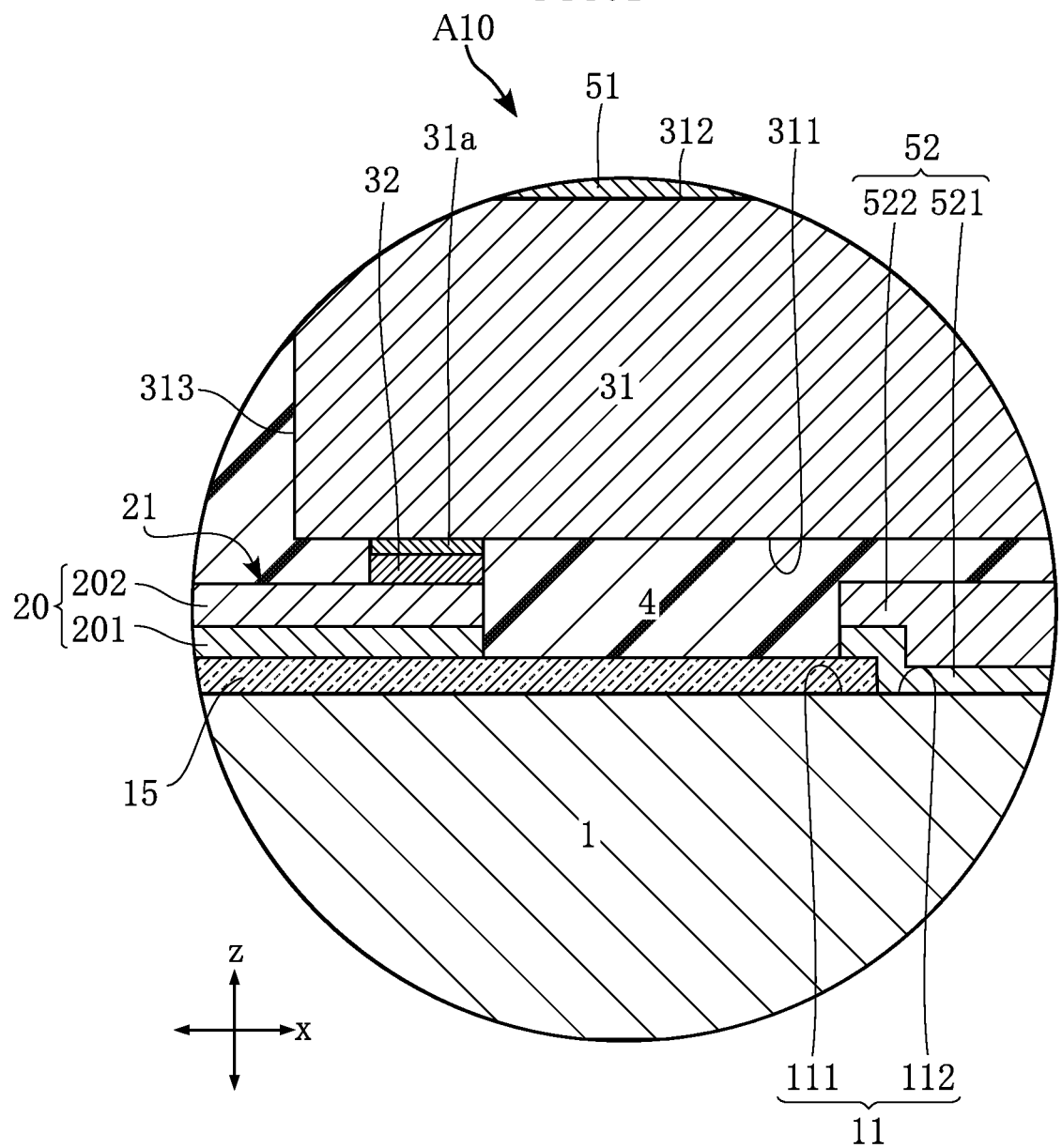
FIG. 4 is a sectional view showing a part of FIG. 2 as enlarged.

FIG. 4 is a sectional view showing a part of FIG. 2 as enlarged. Specifically, FIG. 4 shows the cross sectional configuration of the wiring portion 20 and the second heat dissipation layer 52.

The semiconductor device A10, shown in these figures, is to be surface-mounted on a circuit board of various electronic devices. Note that, in the present specification, the thickness direction of the substrate 1 is referred to as the thickness direction z. The longitudinal direction of the semiconductor device A10 that is perpendicular to the thickness direction z (i.e., the horizontal direction in the plan view) is referred to as the first direction x. The widthwise direction of the semiconductor device A10 (i.e., the vertical direction in the plan view) that is perpendicular to both of the thickness direction z and the first direction x is referred to as the second direction y. As shown in FIG. 1, the semiconductor device A10 is rectangular as viewed in the thickness direction z (hereinafter referred to as "as viewed in plan"). In the present embodiment, the semiconductor device A10 has a dimension of about 300 to 400 μm in the thickness direction z, about 200 to 300 μm in the first direction x, and about 200 to 300 μm in the second direction y. Note that the dimensions of the semiconductor device A10 are not limited.

The substrate 1 is a support member on which the semiconductor element 31 is mounted and functions as the base of the semiconductor device A10. As shown in FIG. 1, the substrate 1 is rectangular, with its longer side extending along the first direction x as viewed in plan. In the present embodiment, the substrate 1 is a plate-like member, and its dimension in the thickness direction z is about 200 to 300 μm. Note that the shape and dimension of the substrate 1 are not limited. The substrate 1 is mainly composed of a single-crystal intrinsic semiconductor, which is Si in the present embodiment. Note however that the material for the substrate 1 is not limited. The substrate 1 has a substrate front surface 11, a substrate back surface 12, and substrate side surfaces 13.

As shown in FIG. 2, the substrate front surface 11 and the substrate back surface 12 are opposite to each other and separated from each other in the thickness direction z. The substrate front surface 11 is flat and rectangular as viewed in plan. When the semiconductor device A10 is mounted on a circuit board, the substrate front surface 11 faces the circuit board. The substrate front surface 11 includes a covered region 111 and an exposed region 112. The covered region 111 is covered with an insulating layer 15, which described later. The exposed region 112 is not covered with the insulating layer 15 and exposed from the insulating layer 15.

The substrate back surface 12 is flat and rectangular as viewed in plan. The substrate back surface 12 is exposed to the outside. As shown in FIG. 2, the substrate side surfaces 13 are between the substrate front surface 11 and the substrate back surface 12. In the present embodiment, the substrate 1 has four substrate side surfaces 13 each facing in the first direction x or the second direction y. The substrate side surfaces 13 are flat and perpendicular to both of the substrate front surface 11 and the substrate back surface 12.

The insulating layer 15 is an electrically insulating film covering a portion (the covered region 111) of the substrate front surface 11 of the substrate 1 as shown in FIG. 2. The insulating layer 15 electrically insulates the substrate 1 and the wiring portion 20 from each other. In the present embodiment, the insulating layer 15 is made of $SiO_2$ and formed by thermal oxidation of the substrate 1. In the present embodiment, the insulating layer 15 may be about 0.7 to 2.0 μm in thickness (dimension in the thickness direction z). Note that the material, thickness, and forming method for the insulating layer 15 are not limited.

The wiring portion 20 is an electric conductor formed on the substrate 1 and electrically connected to the semiconductor element 31 as shown in FIGS. 1, 2 and 4. As shown in FIG. 4, the wiring portion 20 is made up of an underlying layer 201 and a plating layer 202 that are laminated. The underlying layer 201 is formed on the substrate 1 and electrically insulated from the substrate 1 by the insulating layer 15. The underlying layer 201 is made up of a Ti layer and a Cu layer that are laminated, and about 200 to 800 nm in thickness. The plating layer 202 is formed on the outer side of the underlying layer 201 (the side opposite from the substrate 1) in contact with the underlying layer 201. The plating layer 202 is made of Cu and thicker than the underlying layer 201. Specifically, the plating layer 202 may be about 3 to 20 μm in thickness. In the present embodiment, the underlying layer 201 is formed by sputtering, and the plating layer 202 is formed by electroplating. Note that the material, thickness, and forming method of the wiring portion 20 are not limited. The wiring portion 20 of the present embodiment is made up of a plurality of front surface conductors 21.

As shown in FIGS. 1 and 2, the front surface conductors 21 are disposed on the substrate front surf ace 11. In the present embodiment, the semiconductor device A10 has four front surface conductors 21. Each of the front surface conductors 21 is in the form of a strip extending in the first direction x. Note that the number, shape and arrangement of the front surface conductors 21 are not limited.

The columnar portions 25 are electric conductors connecting the wiring portion 20 and the electrode pads 26. In the present embodiment, the semiconductor device A10 has four columnar portions 25. Each of the columnar portions 25 is in the form of a prism that is rectangular in cross section in the x-y plane. The columnar portions 25 are not limited to such a shape and may be in the form of a round column, for example. Each of the columnar portions 25 has a first end in the thickness direction z (the lower end in FIG. 2) connected to the wiring portion 20 (front surface conductor 21) and projects from the wiring portion 20 in the thickness direction z. Each columnar portion 25 has a second end in the thickness direction z (the upper end in FIG. 2) exposed from the sealing resin 4 and connected to an electrode pad 26. Each columnar portion 25 has a top surface 251 and side surfaces 252. The top surface 251 or the above-noted second end is exposed from the sealing resin 4 and in contact with an electrode pad 26. The side surfaces 252 are parallel to the thickness direction z. Each columnar portion 25 has four side surfaces 252 each facing in the first direction x or the second direction y. All of the side surfaces 252 are covered with the sealing resin 4. In the present embodiment, the columnar portions 25 are made of Cu, for example, and formed by electroplating. Note that the number, material, and forming method of the columnar portions 25 are not limited. As shown in FIG. 2, the columnar portions 25 are integrally formed on the wiring portion 20 (front surface conductors 21). Note that the columnar portions 25 may be initially formed separately of the wiring portion 20 and bonded to the wiring portion 20 later.

The electrode pads 26 are terminals for surface-mounting the semiconductor device A10 to the circuit board of an electronic device. The semiconductor device A10 has four electrode pads 26. Each of the electrode pads 26 is an electric conductor that is rectangular as viewed in plan. Each electrode pad 26 is in contact with the entirety of the top surface 251, which is exposed from the sealing resin 4, of a columnar portion 25. As viewed in plan, each electrode pad 26 overlaps with a portion of a corresponding front surface conductor 21. As shown in FIG. 3, each electrode pad 26 may be made up of a Ni layer 261, a Pd layer 262 and a Au layer 263 that are laminated. In the present embodiment, the Ni layer 261 is held in contact with a columnar portion 25, the Au layer 263 is exposed to the outside, and the Pd layer 262 is interposed between the Ni layer 261 and the Au layer 263. As shown in FIG. 1, the electrode pads 26 are located on the outer side of the first heat dissipation layer 51 as viewed in plan. For example, each electrode pad 26 is about 3 to 15 μm in thickness (dimension in the thickness direction z). The electrode pads 26 may be formed by electroless plating. Note that the number, thickness, material, and forming method of the electrode pads 26 are not limited.

The wiring portion 20 (the front surface conductors 21), the columnar portions 25 and the electrode pads 26 constitute a conduction path between the circuit board on which the semiconductor device A10 is mounted and the semiconductor element 31. Note that the arrangement of the wiring portion 20, the columnar portions 25 and the electrode pads 26 shown in FIGS. 1 and 2 is merely an example, and the arrangement of the wiring portion 20, the columnar portions 25 and the electrode pads 26 in the actual semiconductor device A10 is not limited to this.

As shown in FIG. 2, the semiconductor element 31 is electrically connected to the wiring portion 20. The semiconductor element 31 is rectangular as viewed in plan. The semiconductor element 31 is flip-chip mounted. The semiconductor element 31 is disposed in a space roughly defined by the columnar portions 25. In the present embodiment, the semiconductor element 31 is an integrated circuit (IC) such as a MOSFET (Metal Oxide Semiconductor Field Effect Transistor) having a circuit for driving a switching element. The semiconductor element 31 is not limited to this and may be any element formed with various circuits. The semiconductor element 31 may be a Hall element. The semiconductor element 31 has an element front surface 311, an element back surface 312 and element side surfaces 313.

As shown in FIG. 2, the element front surface 311 and the element back surface 312 are opposite to each other and separated from each other in the thickness direction z. The element front surface 311 faces the substrate front surface 11. The element front surface 311 is formed with a plurality of electrode bumps 31a. Each electrode bump 31a may be solder alloy containing Sn. Alternatively, each electrode bump 31a may be made up of a solder alloy layer containing Sn, a Ni layer and a Cu layer; a solder alloy layer containing Sn and a Cu layer; or a Au layer, a Pd layer and a Ni layer. The element back surface 312 faces in the direction in which the substrate front surface 11 faces (the thickness direction z). The element back surface 312 is exposed from the sealing resin 4. The element side surfaces 313 are parallel to the thickness direction z. The semiconductor element 31 of the present embodiment has four element side surfaces 313, each facing in the first direction x or the second direction y. All of the element side surfaces 313 are covered with the sealing resin 4.

As shown in FIGS. 2 and 4, the bonding layers 32 are electric conductors interposed between the electrode bumps 31a of the semiconductor element 31 and the front surface conductors 21. The bonding layers 32 bond the semiconductor element 31 to the front surface conductors 21 to electrically connect the semiconductor element 31 to the front surface conductors 21 (the wiring portion 20). In the present embodiment, the bonding layers 32 are made up of a Ni layer and an alloy layer containing Sn that are laminated. The alloy layer may be lead-free solder such as Sn—Ag-based alloy or Sn—Sb-based alloy. In that case, the Ni layer is held in contact with the front surface conductors 21, whereas the alloy layer is held in contact with the electrode bumps 31a. Note that the material for the bonding layers 32 is not limited. For example, a Cu layer may be interposed between the Ni layer and the front surface conductors 21 or the Ni layer may be dispensed with. The alloy layer is not limited to those described above.

The sealing resin 4 is a synthetic resin with electrically insulating properties, such as one mainly composed of black epoxy resin. As shown in FIG. 2, the sealing resin 4 covers a portion of the semiconductor element 31, and the columnar portions 25. As viewed in plan, the sealing resin 4 overlaps with the substrate 1 and is rectangular. Note that the material and shape of the sealing resin 4 is not limited. The sealing resin 4 has a resin front surface 41 and resin side surfaces 43. All of the resin front surface 41 and the resin side surfaces 43 are exposed surfaces of the semiconductor device A10.

The resin front surface 41 faces in the direction in which the substrate front surface 11 faces (the thickness direction z). The resin front surface 41 is flat. As shown in FIG. 2, the resin front surface 41 is flush with the top surfaces 251 of the columnar portions 25 and the element back surface 312 of the semiconductor element 31.

The resin side surfaces 43 are between the resin front surface 41 and the insulating layer 15. The resin side surfaces 43 are parallel to the thickness direction z. The sealing resin 4 of the present embodiment has four resin side surfaces 43, each facing in the first direction x or the second direction y. As shown in FIG. 2, each resin side surface 43 has a first surface portion 431 and a second surface portion 432. The first surface portion 431 is flat and connected to the resin front surface 41 at one of its edges in the thickness direction z. The second surface portion 432 is flat and connected to the insulating layer 15 at one of its edges in the thickness direction z. The first surface portion 431 is located on the inner side of the second surface portion 432 as viewed in plan so that the resin side surface 43 includes a stepped portion. The second surface portions 432 are flush with the substrate side surfaces 13 of the substrate 1. Note that the configuration of the resin side surfaces 43 is not limited to this. For example, the first surface portions 431 may be located on the outer side of the second surface portions 432 as viewed in plan. Alternatively, each resin side surface 43 may not include a stepped portion and may be an entirely flat surface.

The first heat dissipation layer 51 is provided for dissipating heat generated from the semiconductor element 31. As shown in FIGS. 1 and 2, the first heat dissipation layer 51 covers the element back surface 312 of the semiconductor element 31. Thus, the semiconductor element 31 overlaps with the first heat dissipation layer 51 as viewed in plan. The first heat dissipation layer 51 is exposed from the sealing resin 4 to the outside of the semiconductor device A10. The position of the first heat dissipation layer 51 generally coincides with those of the electrode pads 26 in the thickness direction z. That is, the first heat dissipation layer 51 overlaps partially or entirely with the electrode pads 26 as viewed in a direction perpendicular to the thickness direction z. The first heat dissipation layer 51 is spaced apart and insulated from the electrode pads 26. For example, the first heat dissipation layer 51 is about 3 to 15 μm in thickness.

As shown in FIG. 3, the first heat dissipation layer 51 of the present embodiment is made up of a Ni layer 511, a Pd layer 512, and an Au layer 513 that are laminated. The first heat dissipation layer 51 may be formed by electroless plating. The first heat dissipation layer 51 is formed of the same material and in the same manner as the electrode pads 26. Note that the material and forming method of the first heat dissipation layer 51 is not limited. In the first heat dissipation layer 51, the Ni layer 511 is held in contact with the semiconductor element 31 (the element back surface 312), and the Au layer 513 is exposed to the outside. The Pd layer 512 is interposed between the Ni layer 511 and the Au layer 513. As shown in FIG. 3, the edges of the Ni layer 511 as viewed in plan coincide with the element side surfaces 313, respectively.

The second heat dissipation layer 52 is provided for dissipating heat generated from the semiconductor element 31. As shown in FIG. 2, the second heat dissipation layer 52 is disposed closer to the element front surface 311 than to the element back surface 312 of the semiconductor element 31 in the thickness direction z. In the present embodiment, the second heat dissipation layer 52 is disposed between the semiconductor element 31 (the element front surface 311) and the substrate 1 (the substrate front surface 11). The second heat dissipation layer 52 is spaced apart from the semiconductor element 31 in the thickness direction z. The gap between the second heat dissipation layer 52 and the semiconductor element 31 is filled with the sealing resin 4. The second heat dissipation layer 52 is held in contact with the substrate 1 at the exposed region 112 of the substrate front surface 11. As shown in FIG. 1, at least a portion (entirety in the present embodiment) of the second heat dissipation layer 52 overlaps with the semiconductor element 31 as viewed in plan. In the present embodiment, the second heat dissipation layer 52 extends from one edge to the other edge in the second direction y of the substrate front surface 11 as viewed in plan. The upper surface in FIG. 4 of the second heat dissipation layer 52 is generally at the same position as the upper surface in FIG. 4 of the wiring portion 20 in the thickness direction z. Note that the upper surface in FIG. 4 of the second heat dissipation layer 52 may be at a different position from the upper surface in FIG. 4 of the wiring portion 20 in the thickness direction z.

As shown in FIG. 4, the second heat dissipation layer 52 of the present embodiment is made up of an underlying layer 521 and a plating layer 522 that are laminated. The underlying layer 521 is made up of a Ti layer and a Cu layer that are laminated, and may be formed by sputtering. The plating layer 522 is made of Cu and may be formed by electroplating. That is, the second heat dissipation layer 52 of the present embodiment is formed of the same material and in the same manner as the wiring portion 20. Note that the material and forming method for the second heat dissipation layer 52 is not limited. In the illustrated example, the second heat dissipation layer 52, which is electrically conductive, is spaced apart from the wiring portion 2. In an alternative embodiment, the second heat dissipation layer 52 may be electrically connected to a part of the wiring portion 20 that is at ground potential (reference point) so that second heat dissipation layer 52 functions as a ground conductor.

A method for manufacturing the semiconductor device A10 is described below with reference to FIGS. 5-19. Note that these figures show cross sections in y-z plane along line II-II in FIG. 1. Note also that the thickness direction z, the first direction x and the second direction y of a base 81 (described later) shown in these figures correspond to the thickness direction z, the first direction x and the second direction y of the substrate 1 shown in FIGS. 1-4.

Figure 5:
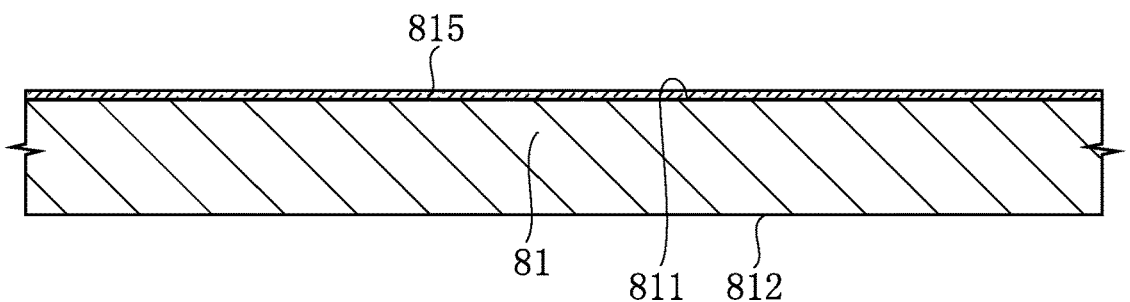
FIG. 5 is a sectional view showing a step of a method for manufacturing the semiconductor device shown in FIG. 1.

First, a base 81 is prepared as shown in FIG. 5. The base 81 corresponds to the substrate 1 of the semiconductor device A10. The base 81 may be made of a single-crystal intrinsic semiconductor and is single-crystal silicon in the present embodiment. The base 81 has a size that can produce a plurality of substrates 1 for making a plurality of semiconductor devices A10. That is, the manufacturing process described below collectively produces a plurality of semiconductor devices A10. As shown in FIG. 5, the base 81 has a front surface 811 and a back surface 812 that are opposite to each other in the thickness direction z. The front surface 811 is a surface to later become the substrate front surface 11.

Figure 6:
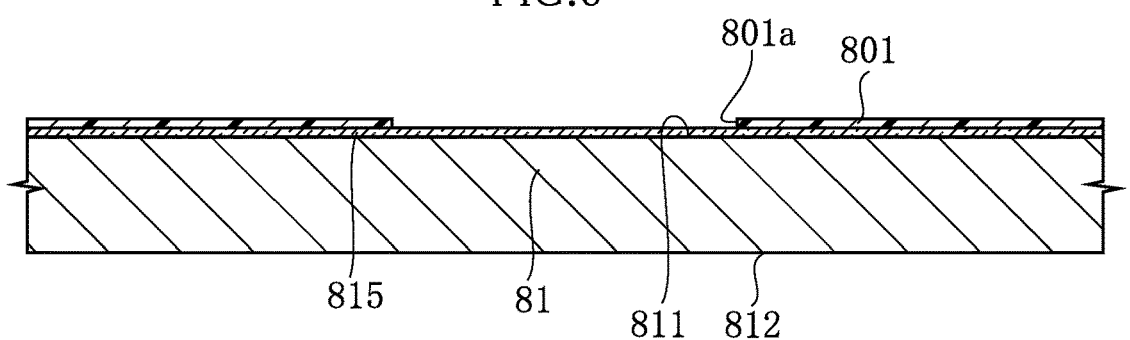
FIG. 6 is a sectional view showing a step of the method for manufacturing the semiconductor device shown in FIG. 1.
Figure 7:
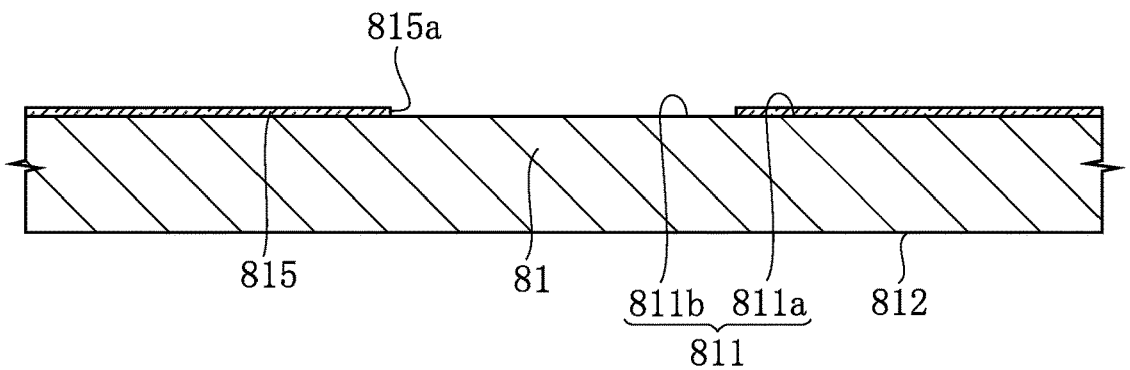
FIG. 7 is a sectional view showing a step of the method for manufacturing the semiconductor device shown in FIG. 1.

Next, an insulating layer 815 is formed as shown in FIGS. 5-7. The insulating layer 815 corresponds to the insulating layer 15 of the semiconductor device A10. Specifically, in this step of forming the insulating layer 815, the front surface 811 of the base 81 is thermally oxidized to form an insulating layer 815 on the entirety of the front surface 811 of the base 81 as shown in FIG. 5. The insulating layer 815 may be formed to a thickness of about 0.7 to 2.0 μm. Then, as shown in FIG. 6, a resist layer 801 is formed by photolithography. Specifically, after a resist layer is formed on the entire surface of the insulating layer 815 by spin coating using a spin coater (rotary coating apparatus) for example, the resist layer is patterned by conducting exposure and development. The resist layer 801 thus patterned has an opening 801a, through which a portion of the insulating layer 815 is exposed. Then, the portion of the insulating layer 815 that is exposed from the resist layer 801 is removed. Thus, the insulating layer 815 having an opening 815a as shown in FIG. 7 is obtained. The above-described partial removal of the insulating layer 815 may be performed by dry etching using a fluorine-based gas. After this process, the front surface 811 of the base 81 has the region 811a covered with the insulating layer 815 and the region 811b exposed from the insulating layer 815 through the opening 815a. The region 811a covered with the insulating layer 815 corresponds to the covered region 111 of the semiconductor device, whereas the region 811b exposed from the insulating layer 815 corresponds to the exposed region 112 of the semiconductor device.

Figure 8:
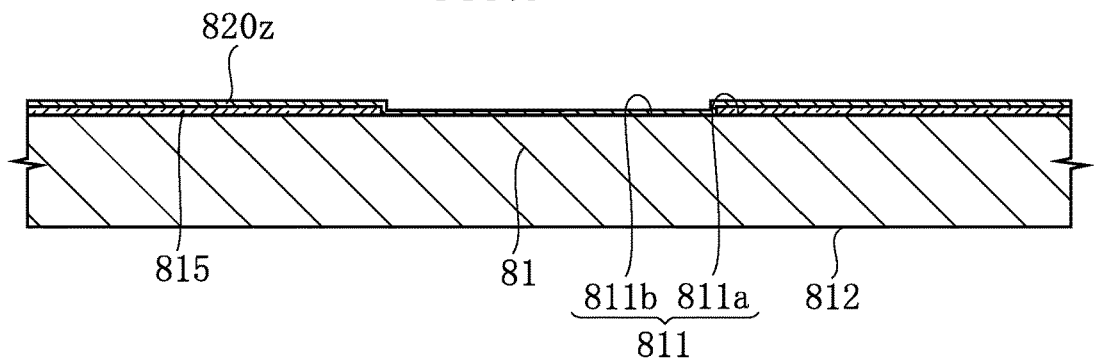
FIG. 8 is a sectional view showing a step of the method for manufacturing the semiconductor device shown in FIG. 1.

Next, an underlying layer 820z is formed as shown in FIG. 8. Note that a portion of the underlying layer 820z (the underlying layer 820a described later) corresponds to the underlying layer 201 of the wiring portion 20 of the semiconductor device A10, and another portion of the underlying layer 820z (the underlying layer 852a described later) corresponds to the underlying layer 521 of the second heat dissipation layer 52 of the semiconductor device A10. The underlying layer 820z is formed by sputtering. The underlying layer 820z may be formed to a thickness of about 200 to 800 nm by laminating a Ti layer and a Cu layer. Specifically, in this step of forming the underlying layer 820z, a Ti layer is first formed on the insulating layer 815 and the base 81, and then a Cu layer is formed on the Ti layer.

Figure 9:
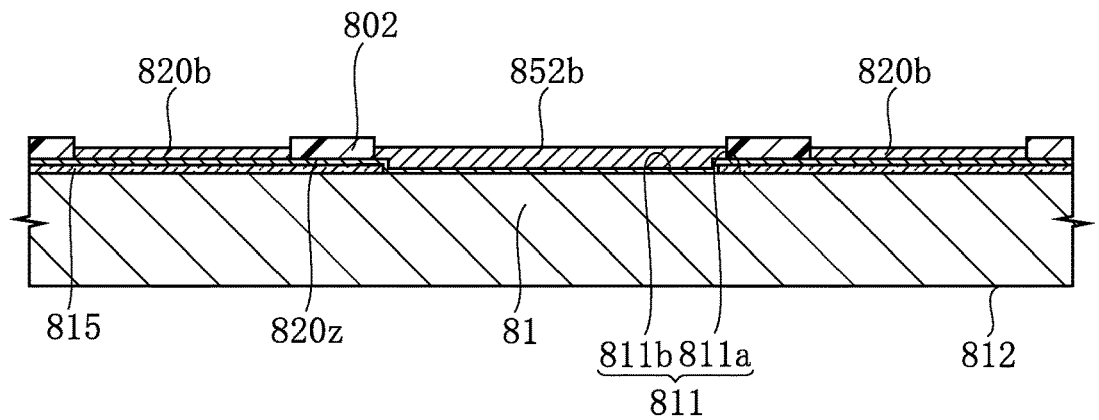
FIG. 9 is a sectional view showing a step of the method for manufacturing the semiconductor device shown in FIG. 1.
Figure 10:
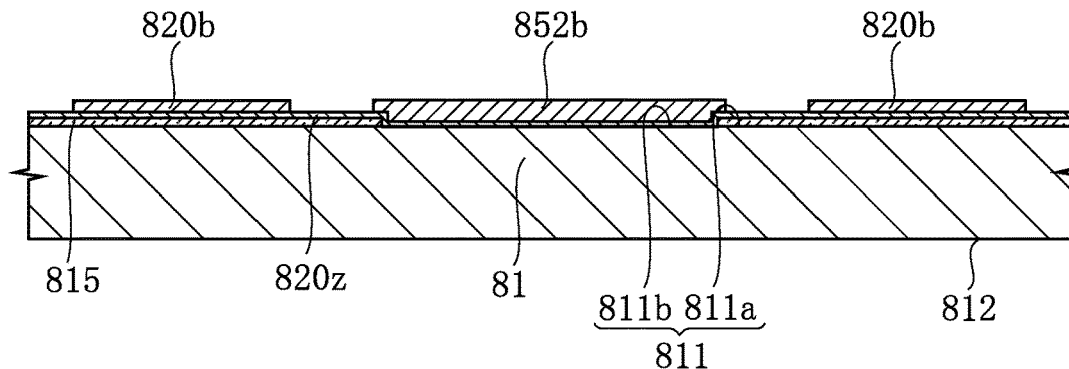
FIG. 10 is a sectional view showing a step of the method for manufacturing the semiconductor device shown in FIG. 1.

Then, plating layers 820b and 852b are formed as shown in FIGS. 9 and 10. The plating layer 820b corresponds to the plating layer 202 of the wiring portion 20 of the semiconductor device A10, whereas the plating layer 852b corresponds to the plating layer 522 of the second heat dissipation layer 52 of the semiconductor device A10. In the present embodiment, the plating layer 820b and the plating layer 852b are formed collectively by patterning through photolithography and electroplating. Specifically, in this step of forming the plating layers 820b and 852b, a resist layer 802 is first formed by photolithography. To form the resist layer 802, photoresist is first applied on the entire surface of the underlying layer 820z by spin coating. Then, the photoresist is patterned by conducting exposure and development. Thus, the resist layer 802 patterned as shown in FIG. 9 is obtained. Then, the plating layers 820b and 852b are formed on the underlying layer 820z at portions exposed from the resist layer 802. The plating layers 820b and 852b are formed by electroplating Cu using the underlying layer 820z as a conduction path. Thereafter, as shown in FIG. 10, the resist layer 802 is removed.

Figure 11:
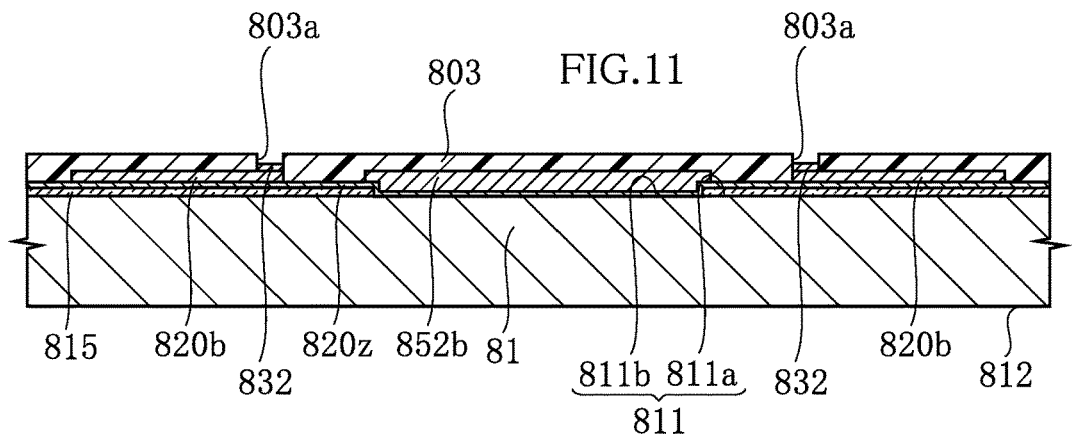
FIG. 11 is a sectional view showing a step of the method for manufacturing the semiconductor device shown in FIG. 1.
Figure 12:
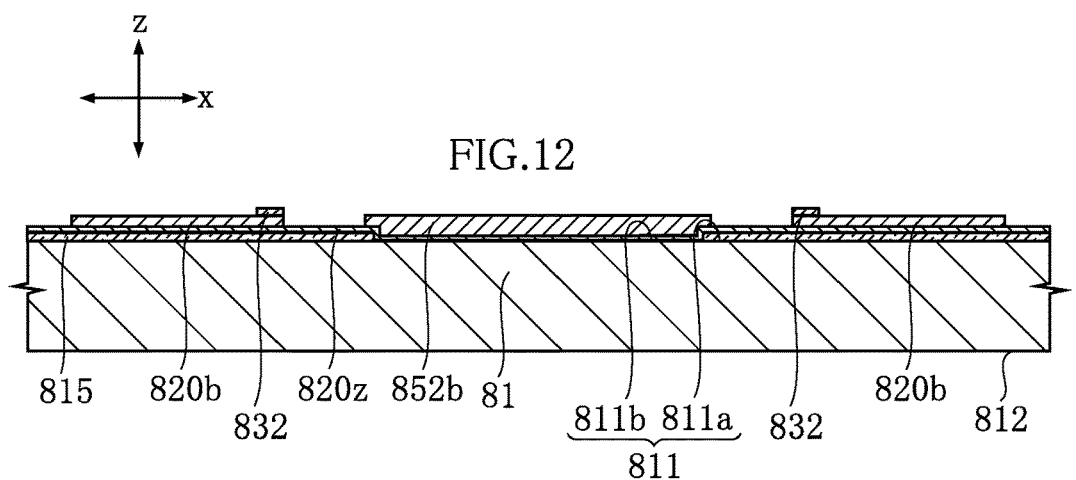
FIG. 12 is a sectional view showing a step of the method for manufacturing the semiconductor device shown in FIG. 1.

Next, the bonding layers 832 are formed as shown in FIGS. 11 and 12. The bonding layers 832 correspond to the bonding layers 32 of the semiconductor device A10. The bonding layers 832 are formed by patterning through photolithography, and electroplating. In this step of forming the bonding layers 832, a resist layer 803 is first formed in a manner similar to the resist layer 802. As shown in FIG. 11, the resist layer 803 thus patterned has openings 803a, through which portions of the plating layer 820b are exposed. In the present embodiment, the openings 803a are in the form of a rectangular parallelepiped. Then, the bonding layers 832 are formed on the plating layer 820b at portions exposed from the resist layer 803. The bonding layers 832 are formed by laminating a Cu layer, a Ni layer, and an alloy layer containing Sn. The alloy layer may be lead-free solder such as Sn—Ag-based alloy or Sn—Sb-based alloy. The bonding layers 832 are formed by electroplating using the underlying layer 820z and the plating layer 820b as a conduction path so as to fill the openings 803a of the resist layer 803. Thereafter, the resist layer 803 is removed as shown in FIG. 12.

Figure 13:
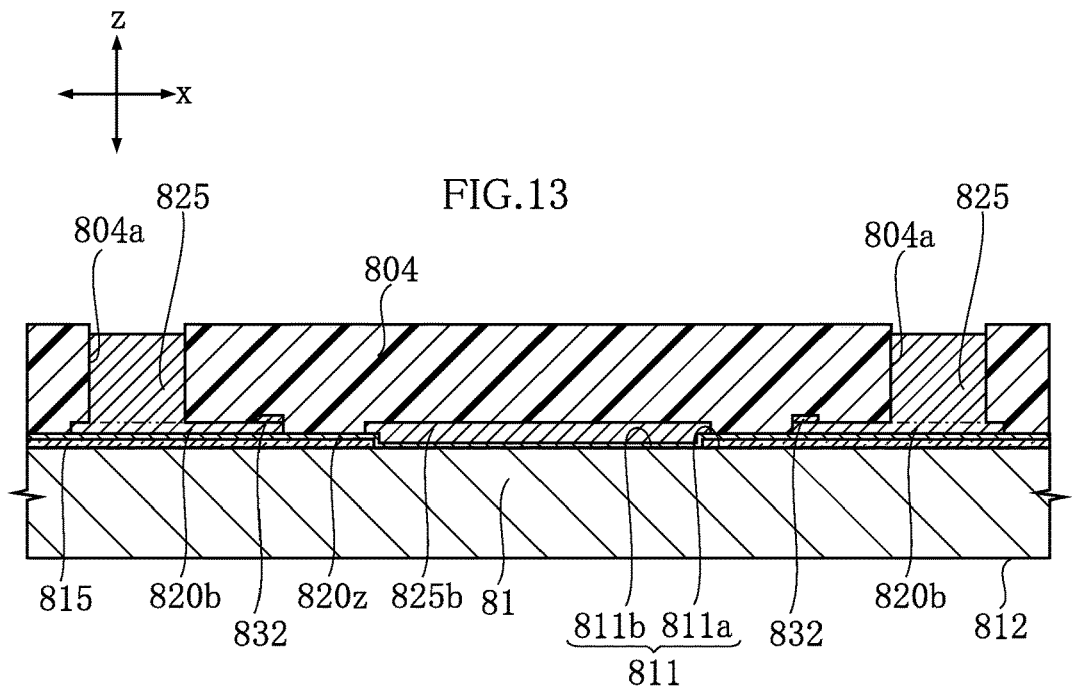
FIG. 13 is a sectional view showing a step of the method for manufacturing the semiconductor device shown in FIG. 1.
Figure 14:
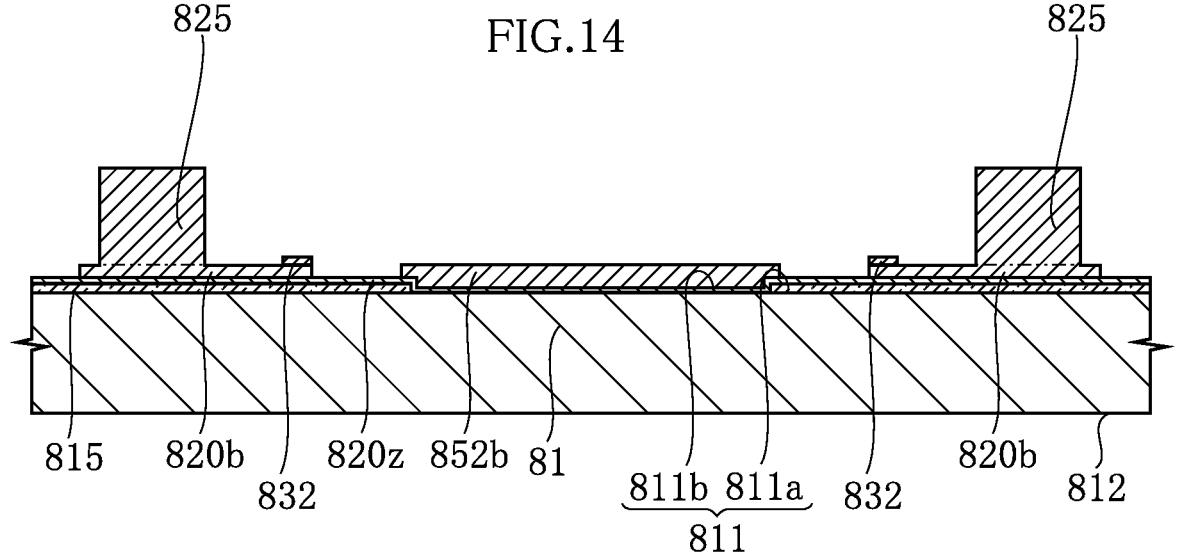
FIG. 14 is a sectional view showing a step of the method for manufacturing the semiconductor device shown in FIG. 1.

Next, the columnar portions 825 are formed as shown in FIGS. 13 and 14. The columnar portions 825 correspond to the columnar portions 25 of the semiconductor device A10. The columnar portions 825 are formed by patterning through photolithography, and electroplating. In this step of forming the columnar portions 825, a resist layer 804 is first formed as shown in FIG. 13. The resist layer 804 may be formed by attaching a dry film resist, which is suitable for achieving a large film thickness. Alternatively, the resist layer 804 may be formed in a manner similar to the resist layer 802 or the resist layer 803. As shown in FIG. 13, the resist layer 804 thus patterned has openings 804a, through which portions of the plating layer 820b are exposed. The thickness of the resist layer 804 depends on the height of the columnar portions 825 to be formed. In the present embodiment, the openings 804a are in the form of a rectangular parallelepiped. Then, columnar portions 825 are formed on the plating layer 820b at the portions exposed through the openings 804a of the resist layer 804. The columnar portions 825 are formed by electroplating Cu using the underlying layer 820z and the plating layer 820b as a conduction path so as to fill the openings 804a. Thereafter, the resist layer 804 is removed as shown in FIG. 14.

Figure 15:
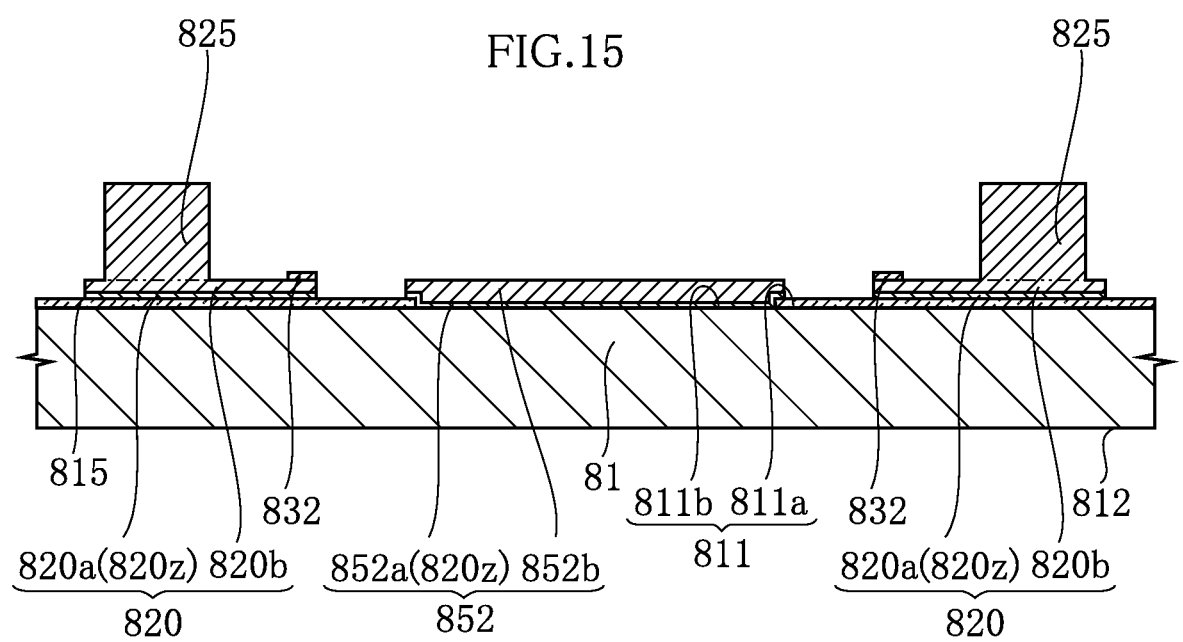
FIG. 15 is a sectional view showing a step of the method for manufacturing the semiconductor device shown in FIG. 1.

Next, as shown in FIG. 15, unnecessary portions of the underlying layer 820z, i.e., the portions that are not covered with the plating layer 820b are removed. The removal of such unnecessary portions of the underlying layer 820z may be performed by wet etching using a mixed solution of sulfuric acid ($H_2SO_4$) and hydrogen peroxide ($H_2O_2$), for example. By removing the portions of the underlying layer 820z in this way, portions of the insulating layer 815 are exposed. Also, by this step, the underlying layer 820z is divided into a portion that is at least partially in contact with the base 81 (the center in the horizontal direction in FIG. 15) and portions that are entirely in contact with the insulating layer 815 (the opposite ends in the horizontal direction in FIG. 15). For easier understanding, the above-described portion of the underlying layer 820z that is at least partially in contact with the base 81 is described as the underlying layer 852a, whereas the above-described portions that are entirely in contact with the insulating layer 815 are described as the underlying layers 820a. In this way, through the above steps, the wiring portion 820, which is made up of the underlying layer 820a and the plating layers 820b, and the second heat dissipation layer 852, which is made up of the underlying layer 852a and the plating layer 852b, are obtained. That is, the wiring portion 820 and the second heat dissipation layer 852 are formed collectively. The wiring portion 820 corresponds to the wiring portion 20 (the front surface conductors 21) of the semiconductor device A10, and the second heat dissipation layer 852 corresponds to the second heat dissipation layer 52 of the semiconductor device A10. As will be understood from above, the process of forming the wiring portion 820 and the second heat dissipation layer 852 includes the steps of forming an underlying layer, forming plating layers and removing unnecessary portions of the underlying layer.

Figure 16:
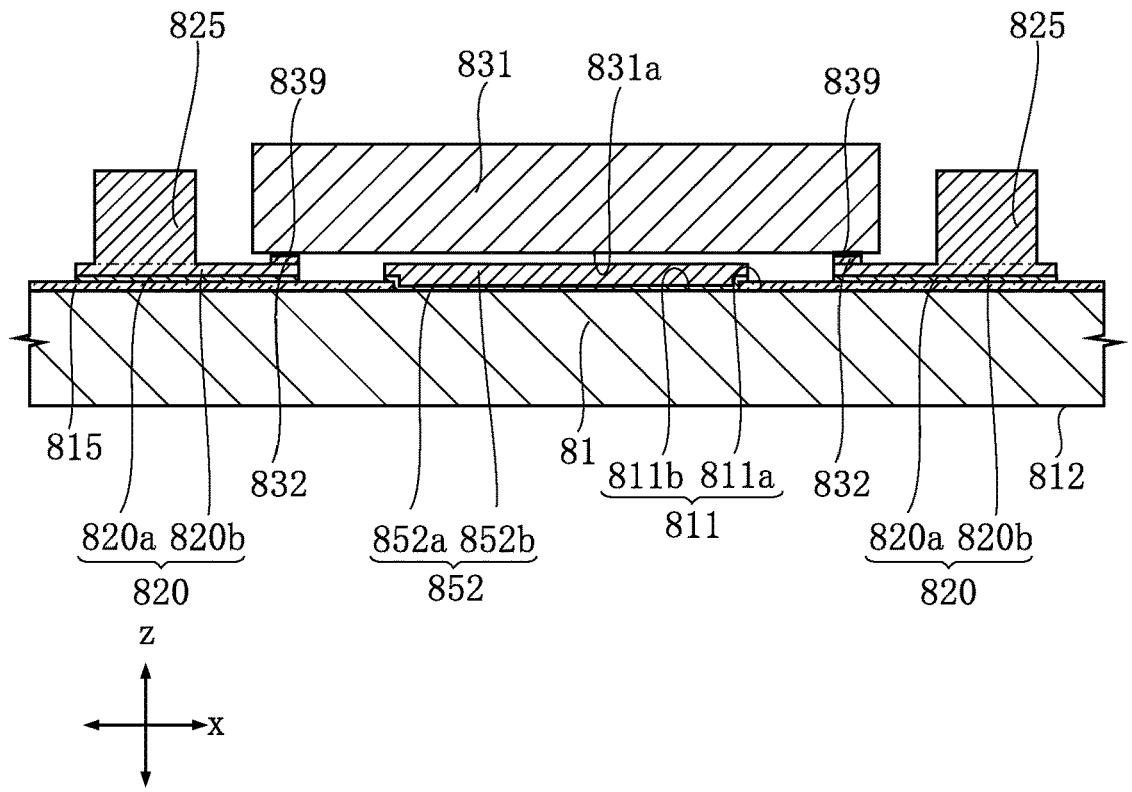
FIG. 16 is a sectional view showing a step of the method for manufacturing the semiconductor device shown in FIG. 1.

Next, as shown in FIG. 16, a semiconductor element 831 is mounted to the wiring portion 820. The semiconductor element 831 corresponds to the semiconductor element 31 of the semiconductor device A10. This step of mounting the semiconductor element 831 is performed by flip chip bonding (FCB). Specifically, after flux is applied to the electrode bumps 839 of the semiconductor element 831, the semiconductor element 831 is temporarily attached to the bonding layers 832 with a flip chip bonder, with the element front surface 831a facing the base 81. In this state, the bonding layers 832 are sandwiched between the wiring portion 820 and the semiconductor element 831. The bonding layers 832 are then melted by reflowing and then cooled to solidify. Thus, the mounting of the semiconductor element 831 is completed.

Figure 17:
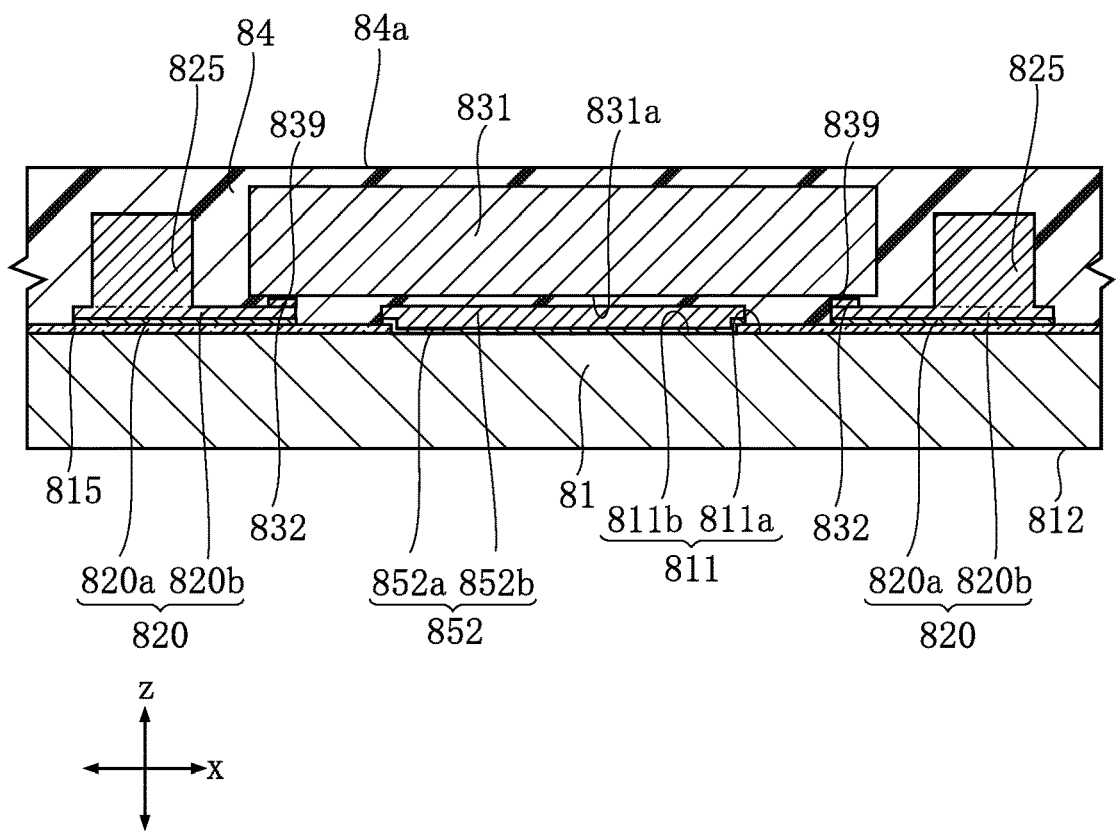
FIG. 17 is a sectional view showing a step of the method for manufacturing the semiconductor device shown in FIG. 1.

Next, as shown in FIG. 17, the sealing resin 84 is formed to cover the semiconductor element 831. The sealing resin 84 corresponds to the sealing resin 4 of the semiconductor device A10. The sealing resin 84 is a synthetic resin with electrically insulating properties, such as one mainly composed of black epoxy resin. In this step of forming the sealing resin 84, the sealing resin 84 is initially formed to entirely cover the semiconductor element 831, the wiring portion 820 and the columnar portions 825. In this state, the front surface 84a of the sealing resin 84 is positioned above the semiconductor element 831 and the columnar portions 825 in the thickness direction z, as shown in FIG. 17.

Figure 18:
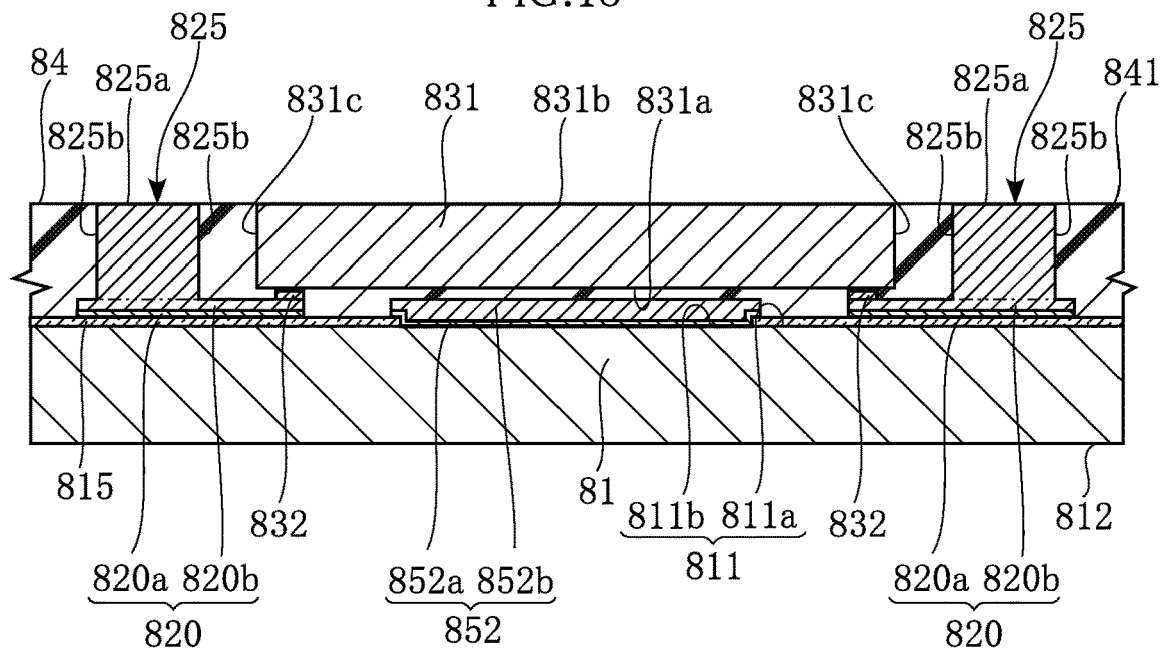
FIG. 18 is a sectional view showing a step of the method for manufacturing the semiconductor device shown in FIG. 1.

Next, as shown in FIG. 18, the sealing resin 84 is partially removed so that the columnar portions 825 and the semiconductor element 831 are exposed. In this step, the columnar portions 825 and the semiconductor element 831 are exposed collectively by mechanical grinding, for example. Specifically, portions of the sealing resin 84 are removed by mechanical grinding from the front surface 84a to expose the columnar portions 825 and the semiconductor element 831. By this step, the element back surface 831b of the semiconductor element 831 and the surfaces 825a of the columnar portions 825, all of which are exposed from the sealing resin 84, are obtained. Also, the resin front surface 841 of the sealing resin 84 is obtained. The element back surface 831b of the semiconductor element 831, the exposed surfaces 825a of the columnar portions 825 and the resin front surface 841 of the sealing resin 84 are all flat and flush with each other. The element back surface 831b of the semiconductor element 831 corresponds to the element back surface 312 of the semiconductor element 31 of the semiconductor device A10, the exposed surfaces 825a of the columnar portions 825 correspond to the top surfaces 251 of the columnar portions 25 of the semiconductor device A10, and the resin front surface 841 of the sealing resin 84 corresponds to the resin front surface 41 of the semiconductor device A10.

Figure 19:
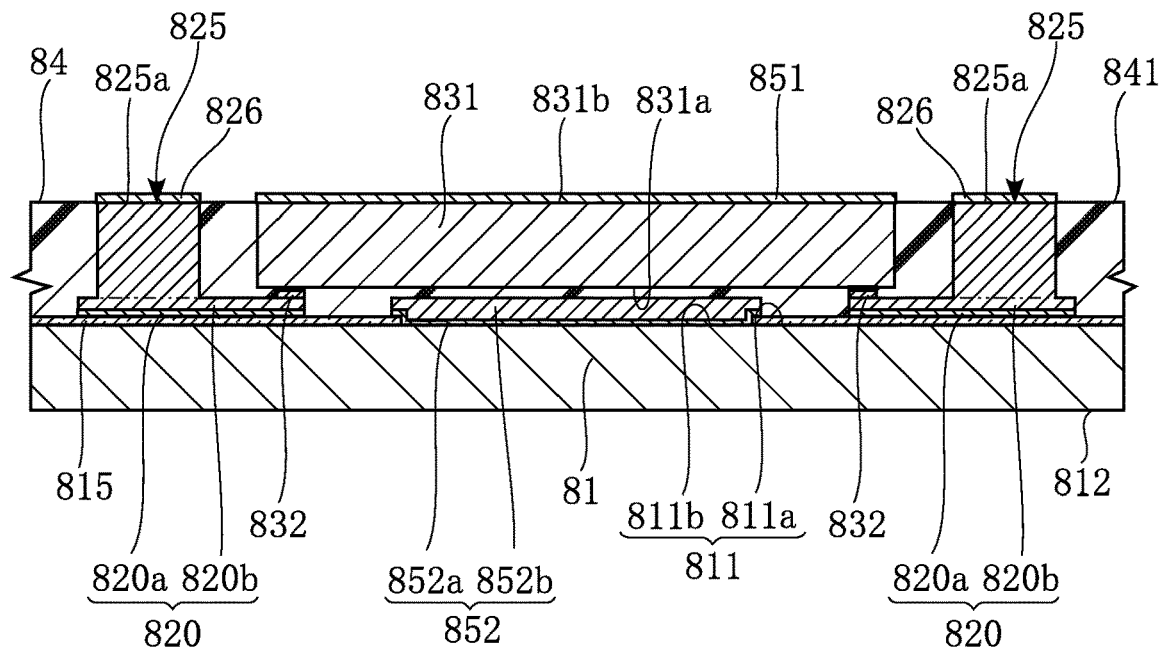
FIG. 19 is a sectional view showing a step of the method for manufacturing the semiconductor device shown in FIG. 1.

Next, as shown in FIG. 19, the electrode pads 826 and the first heat dissipation layer 851 are formed. The electrode pads 826 correspond to the electrode pads 26 of the semiconductor device A10, and the first heat dissipation layer 851 corresponds to the first heat dissipation layer 51 of the semiconductor device A10. The electrode pads 826 and the first heat dissipation layer 851 are formed collectively by depositing a Ni layer, a Pd layer and a Au layer in the mentioned order by electroless plating. Specifically, a Ni layer is deposited to cover the element back surface 831b of the semiconductor element 831, a Pd layer is deposited on the Ni layer, and a Au layer is deposited on the Pd layer, whereby the first heat dissipation layer 851 is formed. In this process, the Ni layer is deposited also on the exposed surfaces 825a of the columnar portions 825, the Pd layer is deposited also on the Ni layer, and the Au layer is deposited also on the Pd layer, whereby the electrode pads 826 are formed. In this way, the electrode pads 826 and the first heat dissipation layer 851 are formed simultaneously. The electrode pads 826 and the first heat dissipation layer 851 are both formed to a thickness of about 3 to 15 μm, for example. Note that the present disclosure describes that the electrode pads 826 and the first heat dissipation layer 851 are formed "simultaneously" even if there is a slight, insignificant difference in formation speed or progress of formation between the electrode pads 826 and the first heat dissipation layer 851. Since the element back surface 831b, the exposed surfaces 825a and the resin front surface 841 are flush with each other as described above, the electrode pads 826 and the first heat dissipation layer 851 coincide in position with each other in the thickness direction z.

Next, a portion of the base 81 is removed from the back surface 812 shown in FIG. 19 by mechanical grinding, for example. This partial removal of the base 81 is optional and may be performed as necessary. Thereafter, the base 81 and the sealing resin 84 are cut along the first direction x and the second direction y for division into pieces corresponding to a plurality of semiconductor devices A10. This cutting may performed by blade dicing, for example. In the present embodiment, the sealing resin 84 is cut from the resin front surface 841 by step cutting. As a result, the first surface portions 431 and the second surface portions 432 of the resin side surfaces 43 shown in FIG. 2 are obtained.

The advantages of the semiconductor device A10 and method for manufacturing the semiconductor device A10 are described below.

The semiconductor device A10 includes the first heat dissipation layer 51. The first heat dissipation layer 51 is held in contact with the semiconductor element 31 (the element back surface 312) and exposed to the outside. Thus, during the operation of the semiconductor device A10, heat generated at the semiconductor element 31 is dissipated to the outside through the first heat dissipation layer 51. Thus, the semiconductor device A10 efficiently dissipates the heat from the semiconductor element 31 to the outside.

The semiconductor device A10 further includes the second heat dissipation layer 52. The second heat dissipation layer 52 is disposed between the semiconductor element 31 (the element front surface 311) and the substrate 1 (the substrate front surface 11) in the thickness direction z. Thus, during the operation of the semiconductor device A10, heat generated at the semiconductor element 31 is dissipated to the outside through the second heat dissipation layer 52 and the substrate 1. Thus, the semiconductor device A10 dissipates the heat generated at the semiconductor element 31 not only from the element back surface 312 through the first heat dissipation layer 51 but also from the element front surface 311 through the second heat dissipation layer 52. Thus, the semiconductor element 31 has enhanced heat dissipation efficiency.

In the semiconductor device A10, the substrate front surface 11 of the substrate 1 includes the region 112 exposed from the insulating layer 15, and the second heat dissipation layer 52 is held in contact with at least a portion (entirety in the present embodiment) of the exposed region 112. With such an arrangement, the second heat dissipation layer 52 conducts heat to the substrate 1 more efficiently than in an arrangement in which the insulating layer 15 is interposed between the second heat dissipation layer 52 and the substrate 1. This also enhances the heat dissipation efficiency of the semiconductor device A10.

In the semiconductor device A10, the top surfaces 251 of the columnar portions 25, the resin front surface 41 and the element back surface 312 are flush with each other. Such an arrangement reduces the dimension of the semiconductor device A10 in the thickness direction z, resulting in height reduction of the device. Moreover, since the electrode pads 26 (826) and the first heat dissipation layer 51 (851) are formed simultaneously by electroless plating as described above, the manufacturing efficiency of the semiconductor device is enhanced.

In the semiconductor device A10, the wiring portion 20 and the second heat dissipation layer 52 are made of a same material. The wiring portion 20(820) and the second heat dissipation layer 52(852) are formed collectively by forming an underlying layer by sputtering, forming plating layers by electroplating and removing unnecessary portions of the underlying layer, as described above. This also enhances the manufacturing efficiency of the semiconductor device.

Although the semiconductor device A10 of the first embodiment includes the substrate 1, the substrate 1 may be dispensed with. Such a semiconductor device without the substrate 1 may be obtained by removing the entirety of the substrate 81 in the step of grinding the base 81 from the back surface 812 described above. In this step, the insulating layer 815 may also be removed to expose the wiring portion 820(20). However, since the wiring portion 20, if exposed, may cause unintentional short-circuiting, it may be preferable to leave the insulating layer 815. Alternatively, the insulating layer 815 may be removed, and the wiring portion 20 may be covered with another insulating film.

A semiconductor device A20 according to a second embodiment is described below with reference to FIGS. 20 and 21. In these figures, the elements that are identical or similar to those of the semiconductor device A10 are provided with the same reference signs as those for the semiconductor device A10, and the descriptions thereof are omitted.

Figure 20:
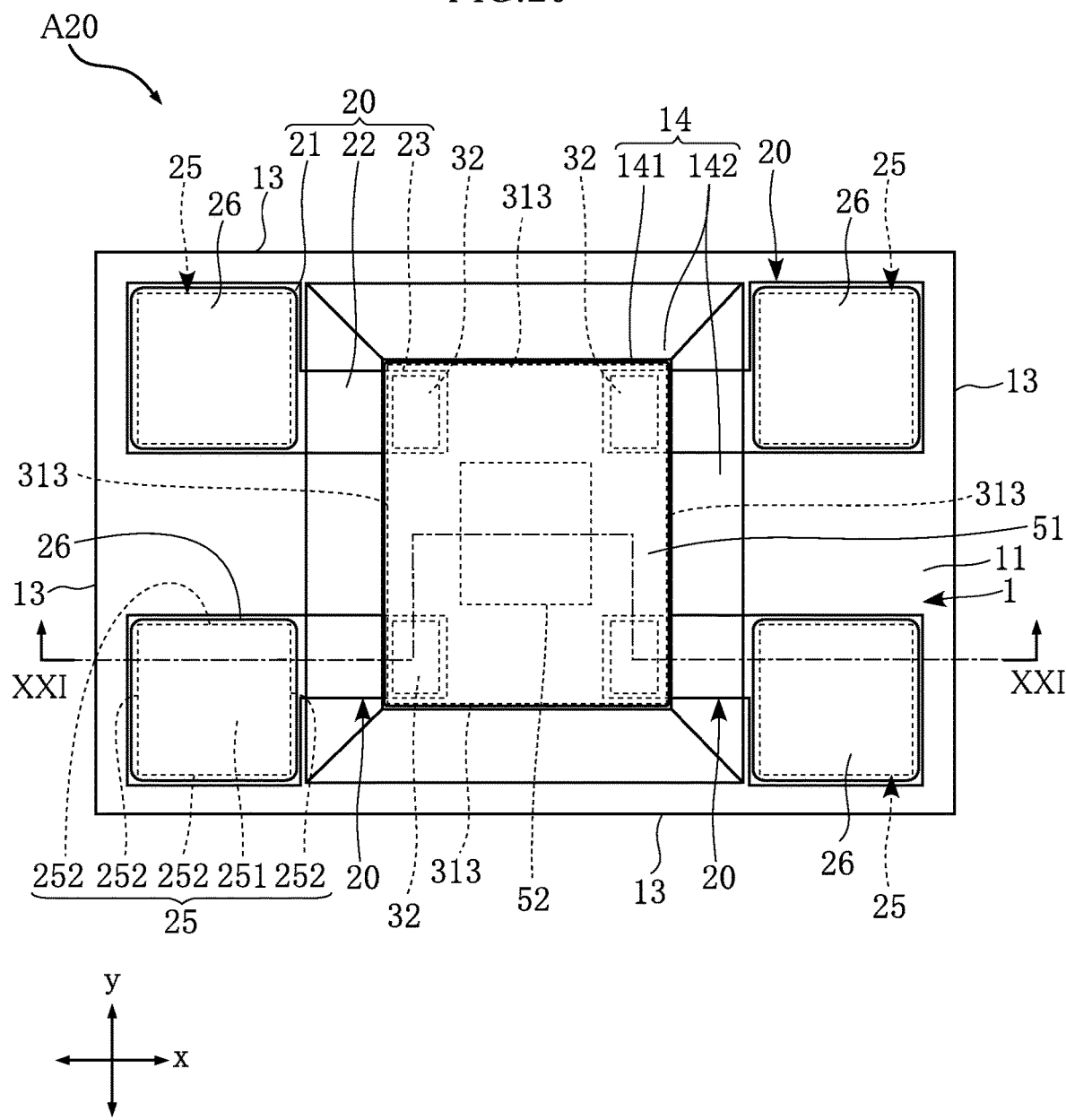
FIG. 20 is a plan view of a semiconductor device according to a second embodiment.

FIG. 20 is a plan view of the semiconductor device A20. Note that illustration of the sealing resin 4 and the insulating layer 15 is omitted in FIG. 20 for easier understanding. FIG. 21 is a sectional view taken along line XXI-XXI in FIG. 20. Although each resin side surface 43 is an entirely flat surface in FIG. 21, each side surface 43 may have a stepped portion as in the first embodiment. The semiconductor device A20 of the present embodiment differs from the semiconductor device A10 in that the substrate 1 is formed with a recess 14.

The substrate 1 of the present embodiment has a substrate front surface 11, a substrate back surface 12, substrate side surfaces 13 and the recess 14. In the present embodiment, the substrate front surface 11 is a (100) surface, which is a surface having a crystal orientation of (100). As shown in FIG. 20, the substrate front surface 11 is in the form of a frame surrounding the recess 14 as viewed in plan.

The recess 14 is formed in the substrate front surface 11. The recess 14 does not penetrate the substrate 1 in the thickness direction z of the substrate 1. The recess 14 is rectangular as viewed in plan. As shown in FIG. 21, the semiconductor element 31 is disposed such that a portion thereof is received in the recess 14. The recess 14 has a bottom surface 141 and connecting surfaces 142.

The bottom surface 141 is the surface to which the semiconductor element 31 is mounted. The bottom surface 141 is a flat surface extending perpendicular to the thickness direction z of the substrate 1 and rectangular as viewed in plan.

Figure 21:
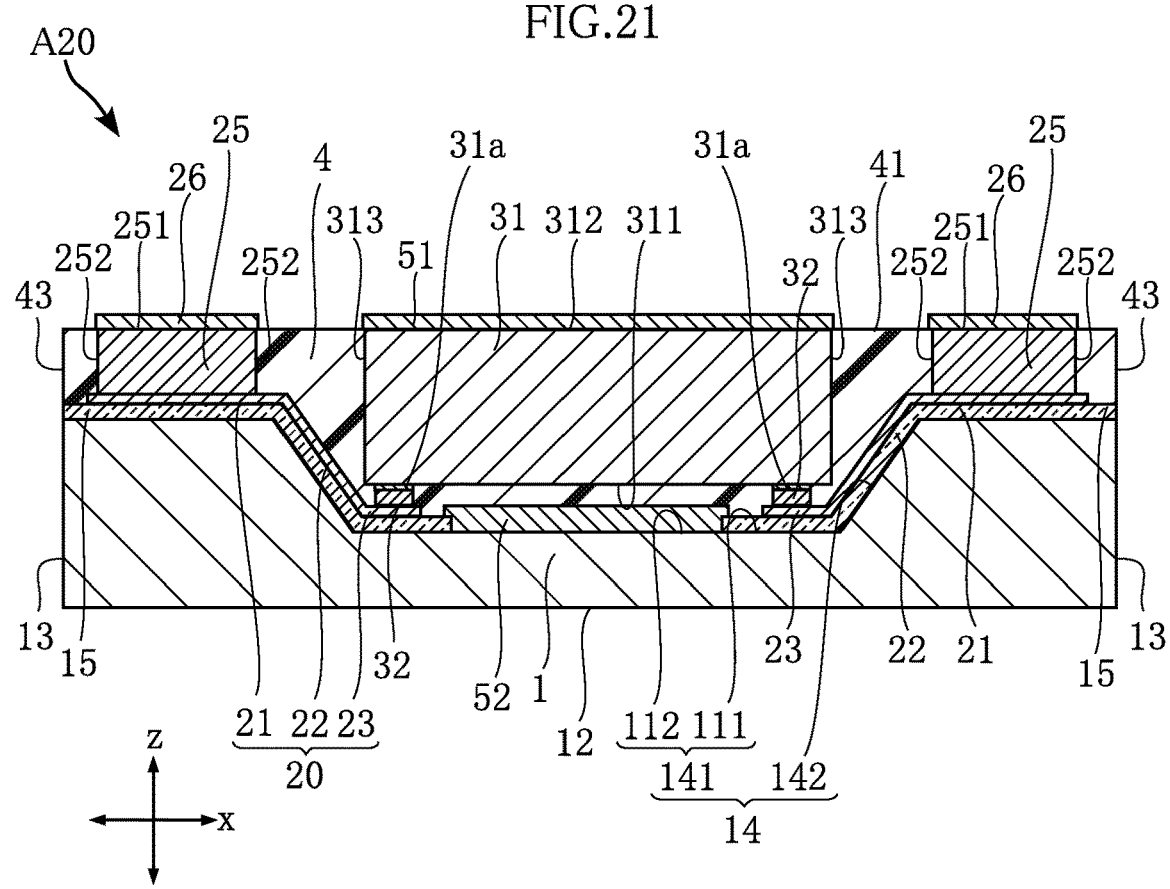
FIG. 21 is a sectional view taken along line XXI-XXI in FIG. 20.

As shown in FIGS. 20 and 21, each of the connecting surfaces 142 is connected to the substrate front surface 11 and the bottom surface 141. Specifically, in the thickness direction z of the substrate 1, the upper end in FIG. 21 of each connecting surface 142 is connected to the substrate front surface 11, whereas the lower end in FIG. 21 of each connecting surface 142 is connected to the bottom surface 141. The connecting surfaces 142 are inclined with respect to the bottom surface 141. In the present embodiment, the recess 14 has four connecting surfaces 142 along the four sides of the bottom surface 141. As the substrate front surface 11 is a (100) surface, each of the connecting surfaces 142 is a (111) surface. Accordingly, all of the connecting surfaces 142 have the same inclination angle with respect to the bottom surface 141, which is about 55° (e.g. 54.7°). In the present embodiment, the recess 14 is formed by anisotropic etching.

The wiring portion 20 includes front surface conductors 21, connecting surface conductors 22 and bottom surface conductors 23.

Each of the front surface conductors 21 is a part of the wiring portion 20 that is formed on the substrate front surface 11 of the substrate 1. Each front surface conductor 21 is connected to a corresponding connecting surface conductor 22 at the boundary along the second direction y between the substrate front surface 11 and a connecting surface 142, and extends from the boundary outward (away from the connecting surface 142) in the first direction x. Each front surface conductor 21 is connected to a corresponding columnar portion 25.

Each of the connecting surface conductors 22 is a part of the wiring portion 20 that is formed on a connecting surface 142 of the substrate 1. Specifically, each connecting surface conductor 22 is formed on either one of a pair of connecting surfaces 142 spaced apart from each other in the first direction x and rectangular as viewed in plan. Each connecting surface conductor 22 extends in parallel to the first direction x, as shown in FIG. 20. In the thickness direction z of the substrate 1, as shown in FIG. 21, the upper end of each connecting surface conductor 22 is connected to a corresponding front surface conductor 21, and the lower end of each connecting surface conductor 22 is connected to a corresponding bottom surface conductor 23.

Each of the bottom surface conductors 23 is a part of the wiring portion 20 that is formed on the bottom surface 141 of the substrate 1. Each bottom surface conductor 23 is connected to a corresponding connecting surface conductor 22 at the boundary along the second direction y between the bottom surface 141 and a connecting surface 142, and extends from the boundary inward of the bottom surface 141 (toward the other connecting surface 142). As shown in FIG.

21, the semiconductor element 31 is electrically connected to the bottom surface conductors 23 via the bonding layers 32.

A method for manufacturing the semiconductor device A20 is described below with reference to FIGS. 22-27. Note that descriptions of the process steps that are common to the method for manufacturing the semiconductor device A10 are omitted. FIGS. 22-27 are sectional views in y-z plane along line XXI-XXI in FIG. 20.

Figure 22:
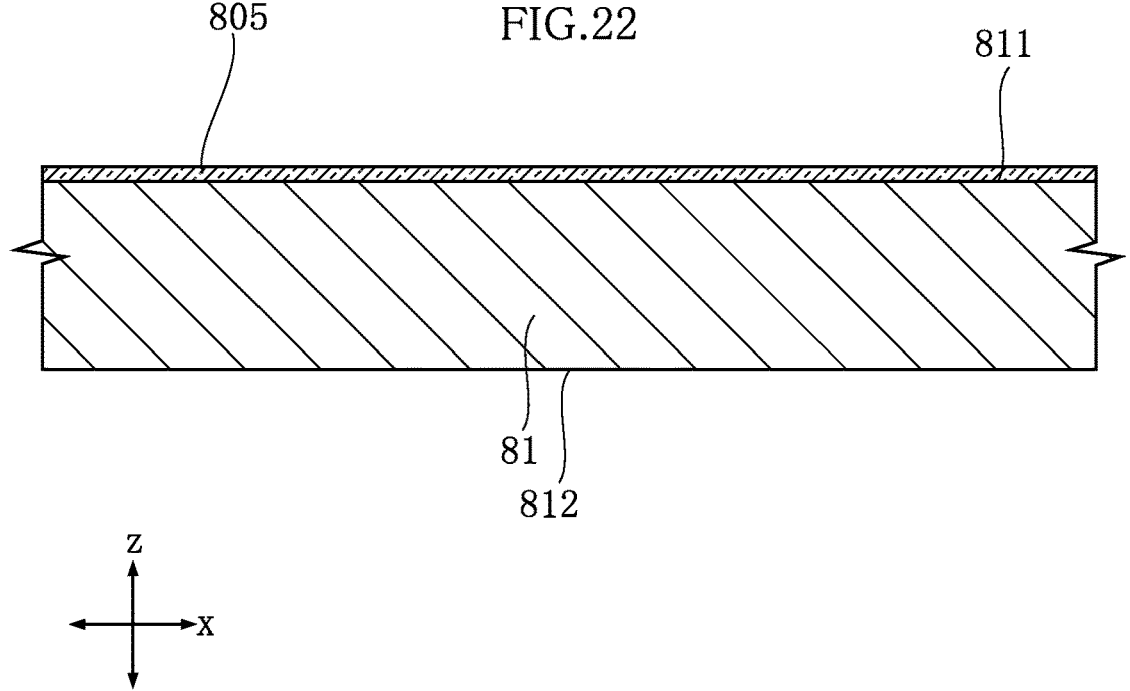
FIG. 22 is a sectional view showing a step of a method for manufacturing the semiconductor device shown in FIG. 20.
Figure 23:
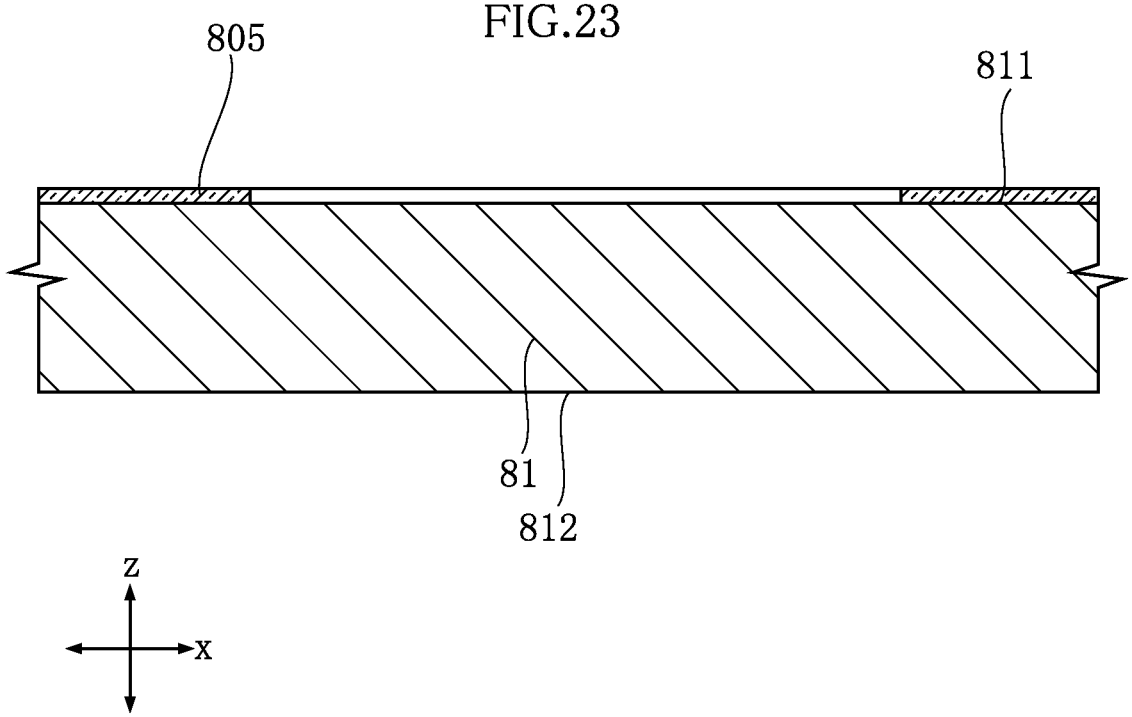
FIG. 23 is a sectional view showing a step of the method for manufacturing the semiconductor device shown in FIG. 20.
Figure 24:
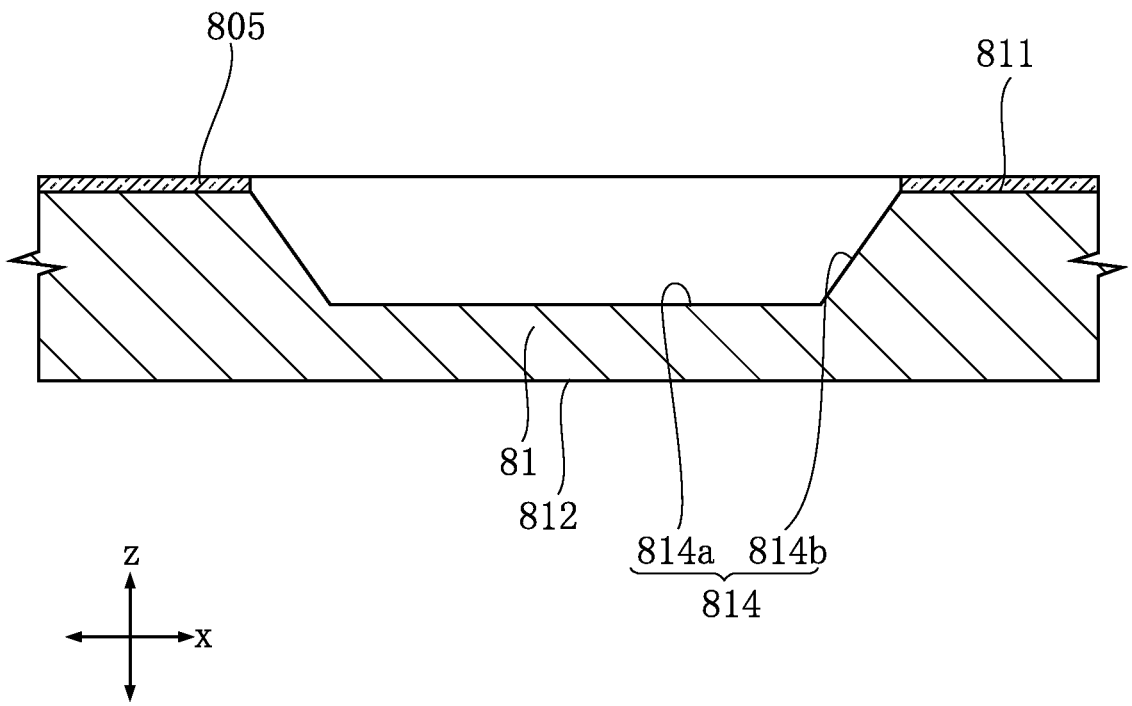
FIG. 24 is a sectional view showing a step of the method for manufacturing the semiconductor device shown in FIG. 20.

First, as shown in FIGS. 22-24, a base 81 is prepared, and a recess 814 is formed in the base 81. The recess 814 corresponds to the recess 14 of the semiconductor device A20. Specifically, as shown in FIG. 22, a base 81 is prepared as in the first embodiment. The base 81 has a front surface 811 having a crystal orientation of (100).

Next, as shown in FIG. 22, the front surface 811 is thermally oxidized to form a mask layer 805 of $SiO_2$. At this stage, the mask layer 805 is formed to cover the entirety of the front surface 811. The mask layer 805 is formed to a thickness of about 0.7 to 2.0 μm, for example.

Next, as shown in FIG. 23, the mask layer 805 is patterned by etching. Specifically, a resist is formed on the mask layer 805 by photolithography, followed by etching the mask layer 805 and removing the resist. By this process, an opening is formed in the mask layer 805. The shape and size of the opening is determined depending on the shape and size of the recess 814 to be formed. In the present embodiment, the opening is rectangular.

Next, a recess 814 is formed in the base 81, as shown in FIG. 24. For example, the recess 814 is performed by anisotropic etching using potassium hydroxide (KOH). KOH solution is an alkaline etching solution suitable for anisotropic etching of single-crystal silicon. By the anisotropic etching, the recess 814 with the bottom surface 814a and the connecting surfaces 814b as shown in FIG. 24 is formed. As the front surface 811 is a (100) surface, each connecting surface 814b is a (111) surface and forms an angle of about 55° (e.g. 54.7°) with respect to the front surface 811 (x-y plane). The depth of the recess 814 (the dimension in the thickness direction z) may be about 50 to 80 μm. The etching solution is not limited to KOH solution, and other alkaline solutions such as tetramethylammonium hydroxide (TMAH) or ethylenediamine pyrocatechol (EDP) may be used. Alternatively, isotropic etching using a solution of fluonitric acid/hydrofluoric-nitric acid (mixed acid of HF and $HNO_3$) as the etching solution may be employed.

Subsequently, the mask layer 805 is removed. The removal of the mask layer 805 may be performed by HF etching. By the recess forming step described above, the recess 814 is formed in the opening in the mask layer 805.

Figure 25:
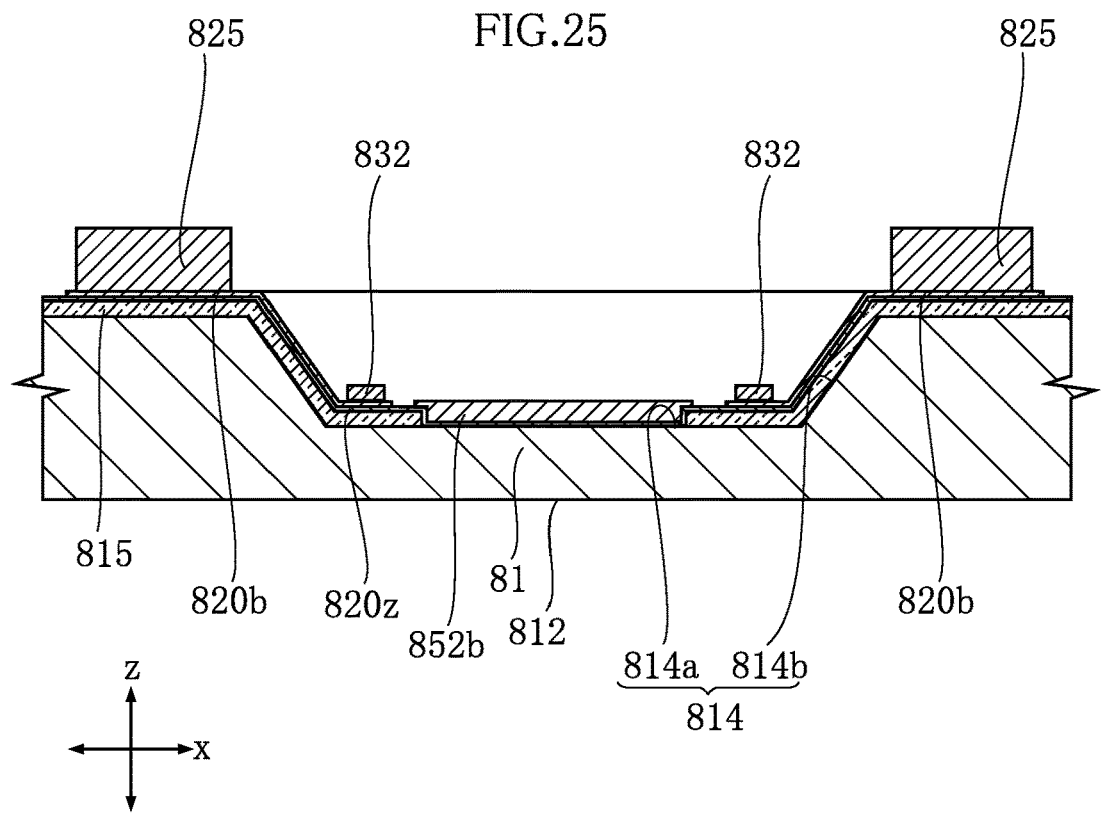
FIG. 25 is a sectional view showing a step of the method for manufacturing the semiconductor device shown in FIG. 20.

Next, as shown in FIG. 25, an insulating layer 815, an underlying layer 820z, plating layers 820b and 852b, bonding layers 832 and columnar portions 825 are formed. These layers or portions are formed in a manner similar to the first embodiment. In the present embodiment, however, the resist layer 802 for forming the plating layers and the resist layer 803 for forming the bonding layers are formed by spray coating or electrodeposition instead of spin coating. Note however that spin coating may be employed as in the first embodiment. The above layers or portions are formed in the same order as in the first embodiment.

Figure 26:
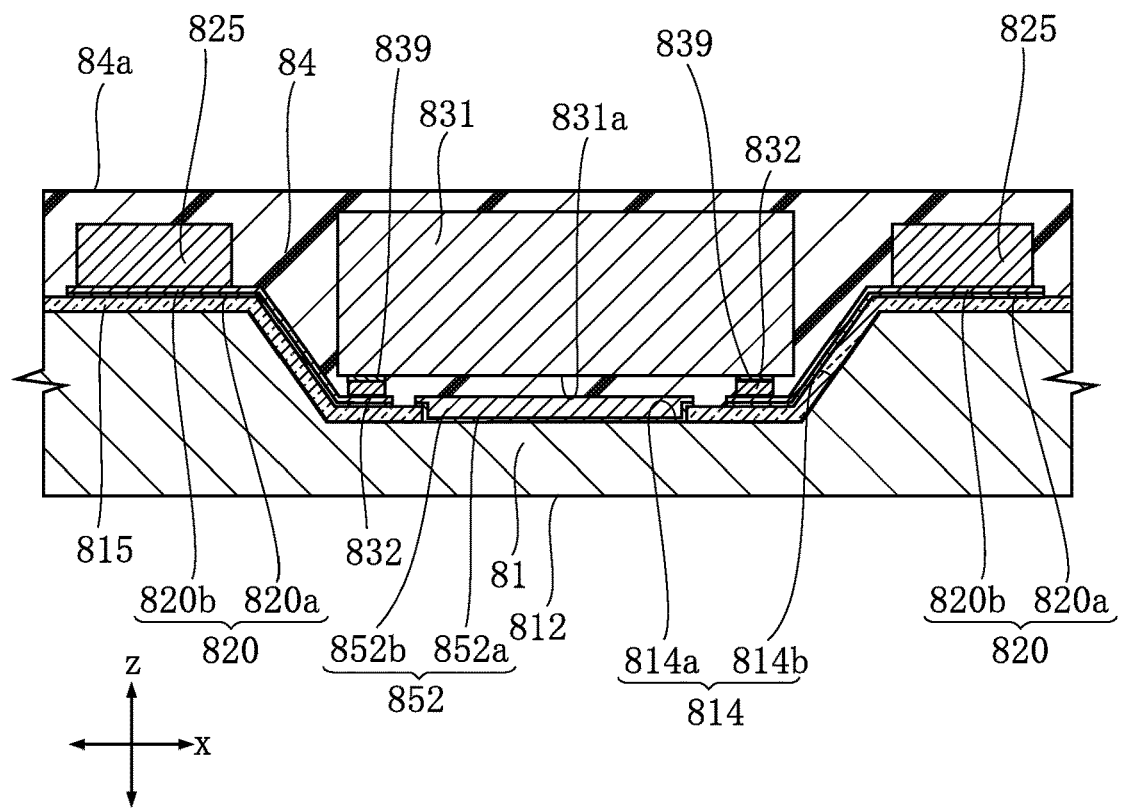
FIG. 26 is a sectional view showing a step of the method for manufacturing the semiconductor device shown in FIG. 20.

Next, as shown in FIG. 26, after unnecessary portions of the underlying layer 820z, i.e., the portions that are not covered with the plating layers 820b and 852b are removed, the semiconductor element 831 is mounted to the base 81, and the sealing resin 84 is formed. These steps are performed in a manner similar to the first embodiment. In the present embodiment, however, the semiconductor element 831 is mounted to the bottom surface 814a of the recess 814 so that a portion of the semiconductor element 31 is received in the recess 14.

Figure 27:
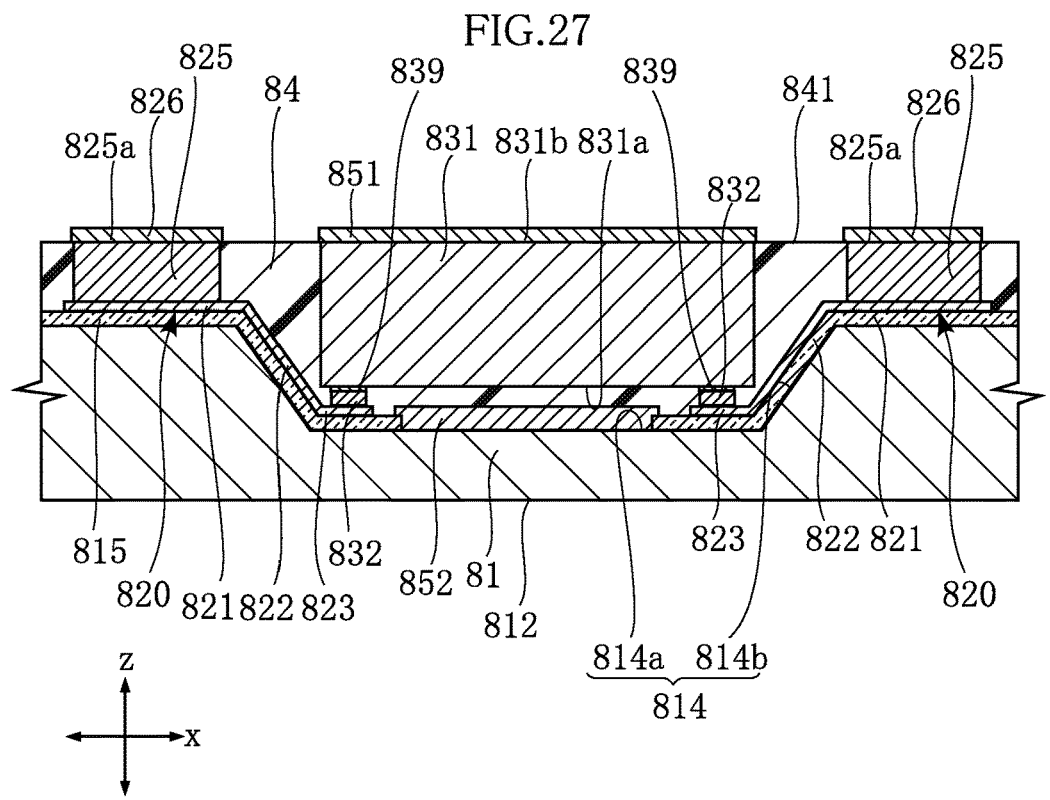
FIG. 27 is a sectional view showing a step of the method for manufacturing the semiconductor device shown in FIG. 20.

Next, as shown in FIG. 27, after the columnar portions 825 and the semiconductor element 831 are exposed from the sealing resin 84, the electrode pads 826 and the first heat dissipation layer 851 are formed. These steps are performed in a manner similar to the first embodiment. Note that, in FIG. 27, the underlying layer 820a and the plating layer 820b are collectively denoted as the wiring portion 820, and the underlying layer 852a and the plating layer 852b as the second heat dissipation layer 852.

Thereafter, as with the first embodiment, a portion of the base 81 may be removed from the back surface 812 by grinding as necessary. Thereafter, the base 81 and the sealing resin 84 are cut along the first direction x and the second direction y by blade dicing for division into pieces corresponding to a plurality of semiconductor devices A20. Thus, the manufacturing of the semiconductor device A20 is completed.

The advantages of the semiconductor device A20 and method for manufacturing the semiconductor device A20 are described below.

As with the semiconductor device A10, the semiconductor device A20 includes the first heat dissipation layer 51. Thus, as with the first embodiment, heat generated at the semiconductor element 31 is dissipated to the outside from the element back surface 312. This provides the same advantage as the first embodiment.

Also, as with the semiconductor device A10, the semiconductor device A20 includes the second heat dissipation layer 52. Thus, as with the first embodiment, the semiconductor device A20 dissipates the heat generated at the semiconductor element 31 not only from the element back surface 312 through the first heat dissipation layer 51 but also from the element front surface 311 through the second heat dissipation layer 52. This also provides the same advantage as the first embodiment.

Though not described, the parts or elements of the semiconductor device A20 or the steps of the manufacturing method that are the same as those of the first embodiment provide the same advantages as those of the first embodiment.

Figure 28:
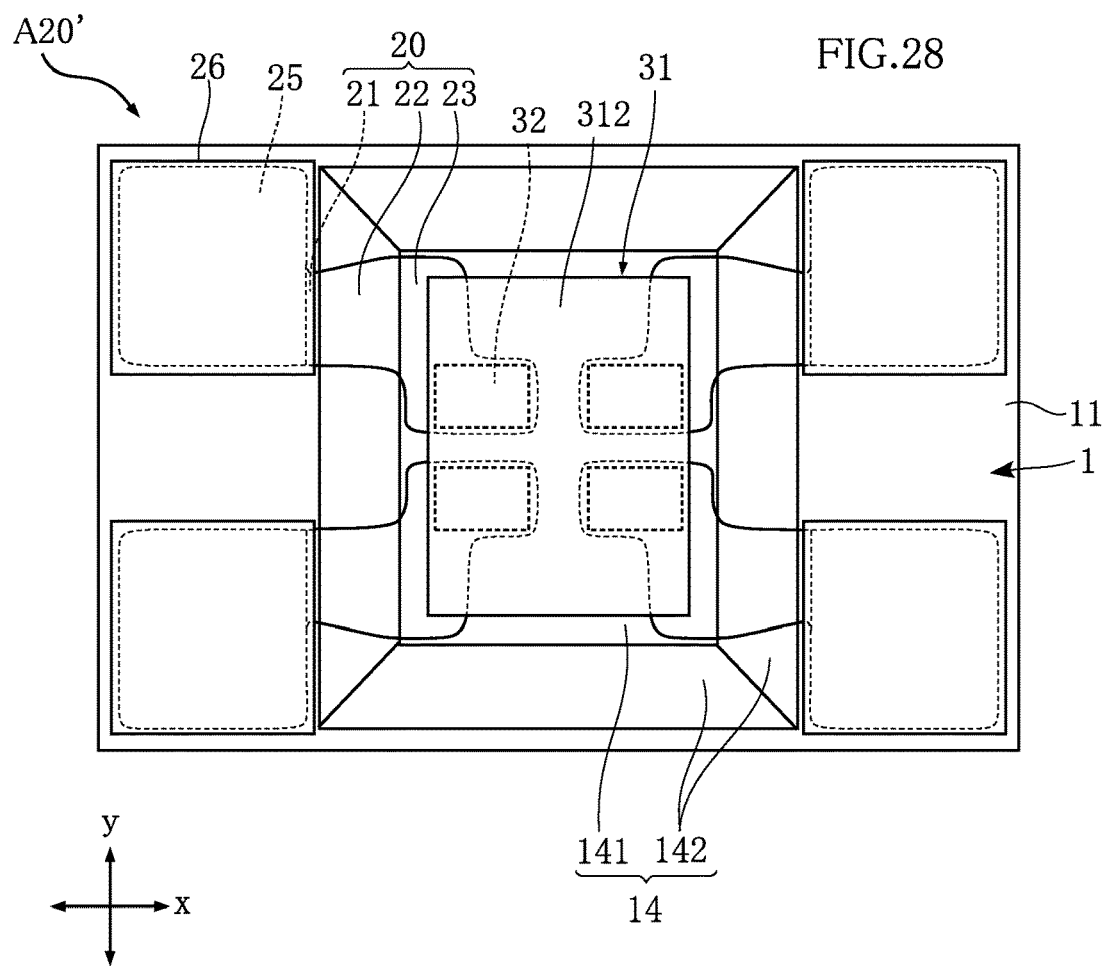
FIG. 28 is a plan view of a semiconductor device according to a variation of the second embodiment.

In the second embodiment, the shape of the wiring portion 20 as viewed in plan is not limited to that shown in FIG. 20. For example, the wiring portion 20 may have such a shape as shown in FIG. 28. Shown in FIG. 28 is a semiconductor device A20' according to such a variation. Note that FIG. 28 is a plan view corresponding to FIG. 20.

As described above, the semiconductor device A20' differs from the semiconductor device A20 in shape of the wiring portion 20. Accordingly, the arrangement of the electrode bumps 31a in the semiconductor device A20' is also different from that in the semiconductor device A20. Specifically, in the semiconductor device A20', the four electrode bumps 31a are arranged near the center of the element front surface 311 of the semiconductor element 31. The bottom surface conductors 23 on the bottom surface 141 of the substrate 1 extend to near the center of the bottom surface 141 for connection to the electrode bumps 31a, respectively. Each of the connecting surface conductors 22 on the connecting surfaces 142 of the substrate 1 has a width (dimension in the second direction y) that increases as proceeding from the substrate front surface 11 toward the bottom surface 141. As shown in FIG. 28, each connecting surface conductor 22 has an inner edge (the edge closer to the center of the semiconductor device A20' in the second direction y) that is parallel to the first direction x, and outer edge (the edge farther away from the center of the semiconductor device A20' in the second direction y) that is inclined with respect to the first direction x.

The semiconductor device A20' having the above-described configuration has the same advantages as those of the semiconductor device A20.

Note that the shape of the connecting surface conductors 22 is not limited to that described above with reference to FIG. 28. For example, each connecting surface conductor 22 may have an outer edge parallel to the first direction x and an inner edge inclined with respect to the first direction x. Alternatively, both of the inner edge and the outer edge of each connecting surface conductor 22 may be inclined with respect to the first direction x. The width of each connecting surface conductor 22 may decrease as proceeding from the substrate front surface 11 toward the bottom surface 141.

Note that although the semiconductor device shown in this variation does not include the second heat dissipation layer 52, the semiconductor device may include the second heat dissipation layer 52.

A semiconductor device A30 according to a third embodiment is described with reference to FIGS. 29 and 30. In these figures, the elements that are identical or similar to those of the semiconductor device A10 or A20 are provided with the same reference signs as those for the semiconductor device A10 or A20, and the descriptions thereof are omitted.

Figure 29:
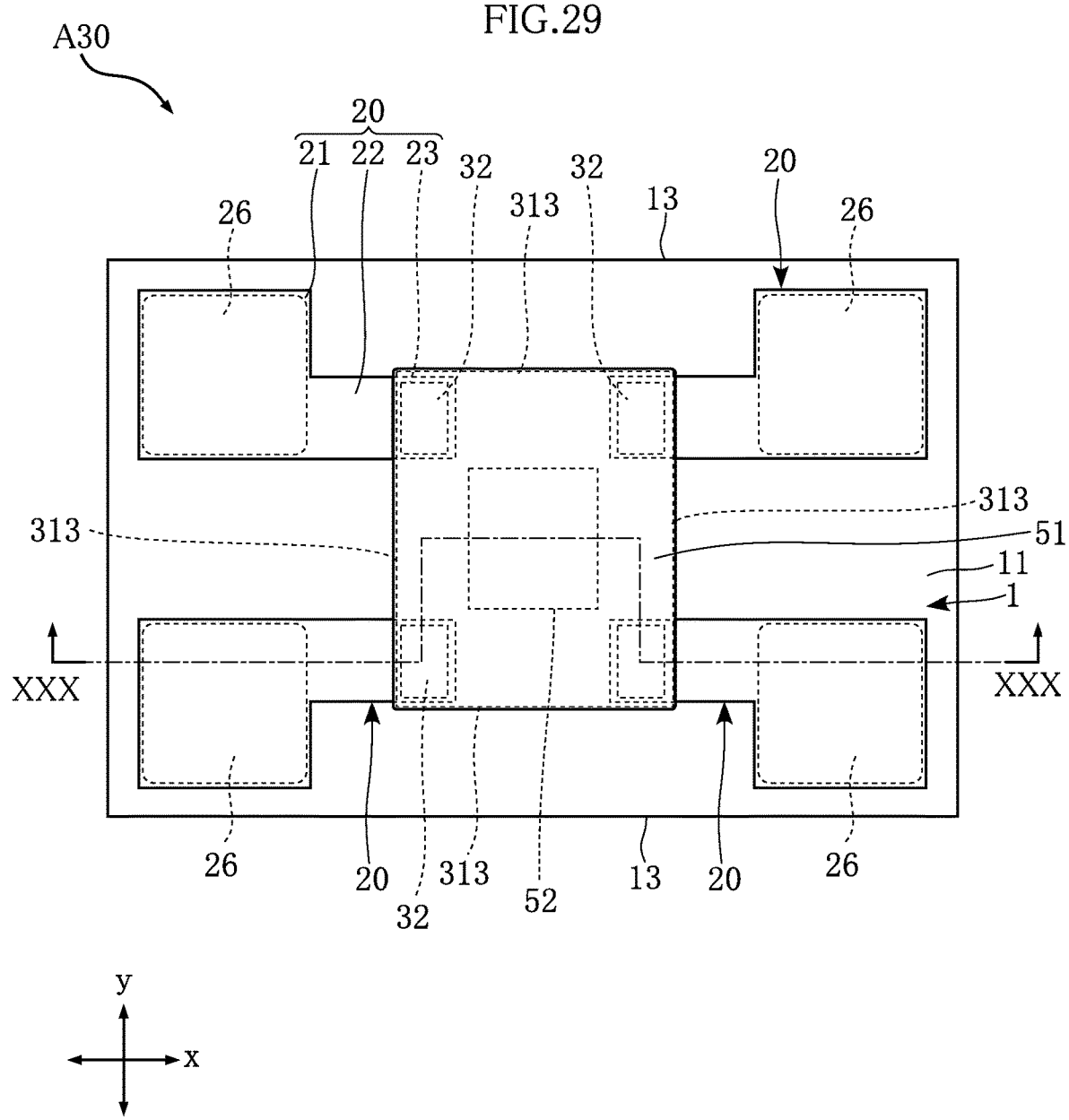
FIG. 29 is a plan view of a semiconductor device according to a third embodiment.

FIG. 29 is a plan view of the semiconductor device A30. Note that illustration of the sealing resin 4 and the insulating layer 15 is omitted in FIG. 29 for easier understanding. FIG. 30 is a sectional view taken along line XXX-XXX in FIG. 29. Although each resin side surface 43 shown in FIG. 30 is an entirely flat surface, each side surface 43 may have a stepped portion as in the first embodiment. The semiconductor device A30 of the present embodiment differs from the semiconductor device A10 in that the semiconductor device A30 does not include the columnar portions 25 and that the electrode pads 26 are provided adjacent to the substrate back surface 12 of the substrate 1.

The substrate 1 of the present embodiment has a substrate front surface 11, a substrate back surface 12, substrate side surfaces 13 and through-holes 16. As with the substrate 1 of the second embodiment, the substrate front surface 111 is a (100) surface, which is a surface having a crystal orientation of (100). As shown in FIG. 30, the semiconductor element 31 is mounted to the substrate front surface 11.

Figure 30:
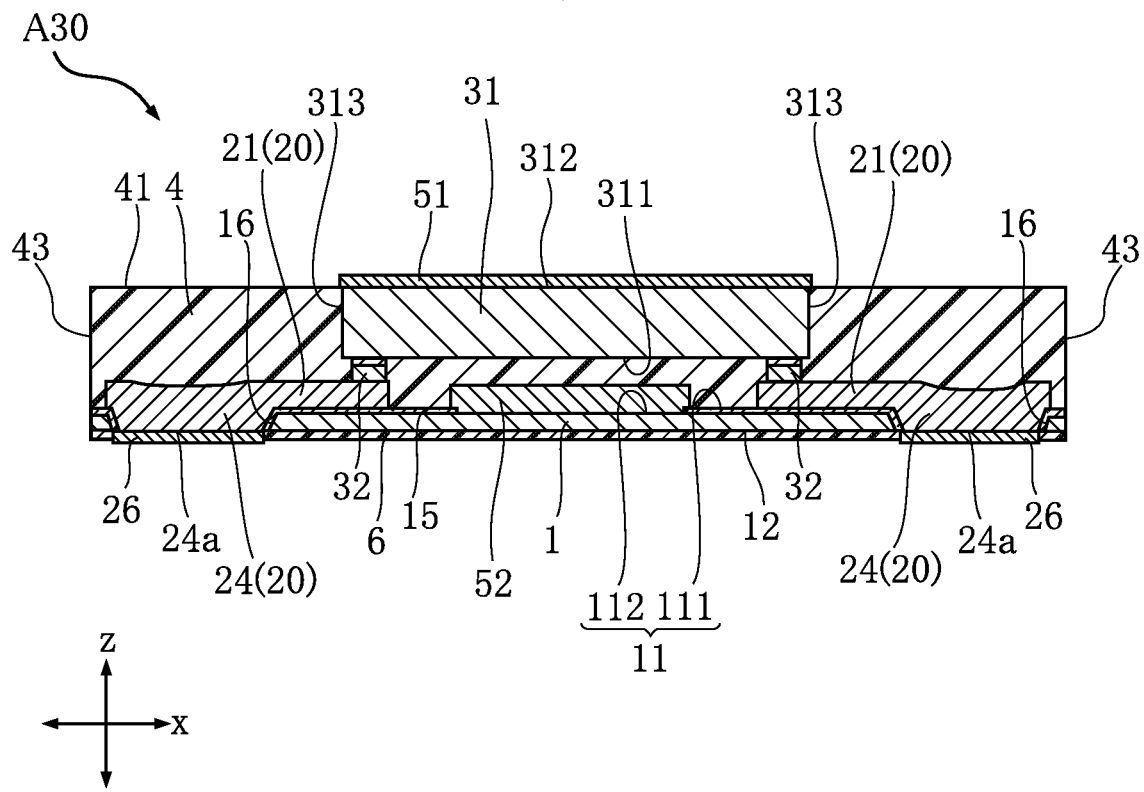
FIG. 30 is a sectional view taken along line XXX-XXX in FIG. 29.

As shown in FIG. 30, the through-holes 16 penetrate the substrate 1 from the substrate front surface 11 to the substrate back surface 12 in the thickness direction z. In the present embodiment, as understood from FIG. 29, the substrate 1 has four through-holes 16 adjacent to the four corners of the substrate 1. Each of the through-holes 16 is rectangular as viewed in plan. Each through-hole 16 has an opening dimension of about 200 to 300 μm on the substrate front surface 11 side. Note that the number, arrangement, shape and dimension of the through-holes 16 are not limited. As shown in FIG. 30, the insulating layer 15 is formed also on the inner surfaces of the through-holes 16.

The wiring portion 20 of the present embodiment includes front surface conductors 21 and through conductors 24. The through conductors 24 are formed to penetrate the substrate 1. Specifically, the through conductors 24 are formed inside the through-holes 16 so as to fill the through-holes 16. The through conductors 24 are exposed from the substrate front surface 11 and the substrate back surface 12 of the substrate 1. The first end of each through conductor 24, which is the end exposed from the substrate front surface 11, is connected to a corresponding front surface conductor 21. The second end of each through conductor 24, which is the end exposed from the substrate back surface 12, is connected to a corresponding electrode pad 26. In the present embodiment, each through conductor 24 is in the form of a prism and has an exposed surface 241. The exposed surface 241 is the surface of the second end exposed from the substrate back surface 12 and flush with the substrate back surface 12. The shape of the through conductors 24 is not limited and may be in the form of a round column, for example. In the present embodiment, the front surface conductors 21 and the through conductors 24 are made of the same material and integral with each other. Note however that the front surface conductors 21 and the through conductors 24 may be formed separately using different materials.

In the present embodiment, the electrode pads 26 are formed in contact with the entirety of the exposed surfaces 241 of the through conductors 24.

The semiconductor device A30 includes a resin film 6. The resin film 6 is formed on the substrate back surface 12. The resin film 6 covers the entirety of the substrate back surface 12 except the portions at which the electrode pads 26 are formed. The resin film 6 electrically insulates the electrode pads 26 from each other.

A method for manufacturing the semiconductor device A30 is described below with reference to FIGS. 31-35. Note that descriptions of the process steps that are common to the method for manufacturing the semiconductor device A10 or A20 are omitted. FIGS. 31-35 are sectional views in y-z plane along line XXX-XXX in FIG. 29.

Figure 31:
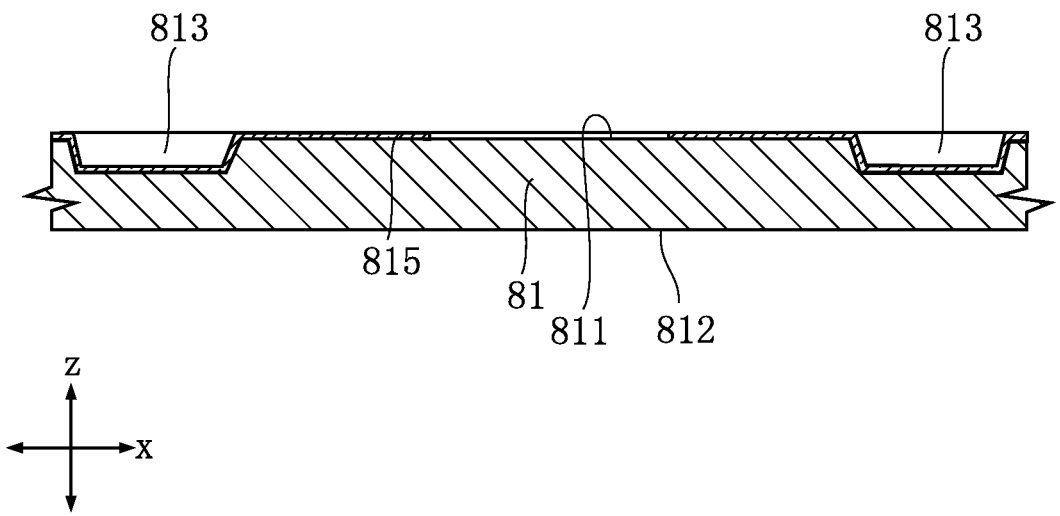
FIG. 31 is a sectional view showing a step of a method for manufacturing the semiconductor device shown in FIG. 29.

First, as shown in FIG. 31, a base 81 is prepared, and recesses 813 are formed in the front surface 811 of the base 81. The recesses 813 are the portions to later become the through-holes 816 and formed in a manner similar to the recess 814 of the second embodiment (see FIGS. 22-24).

Figure 32:
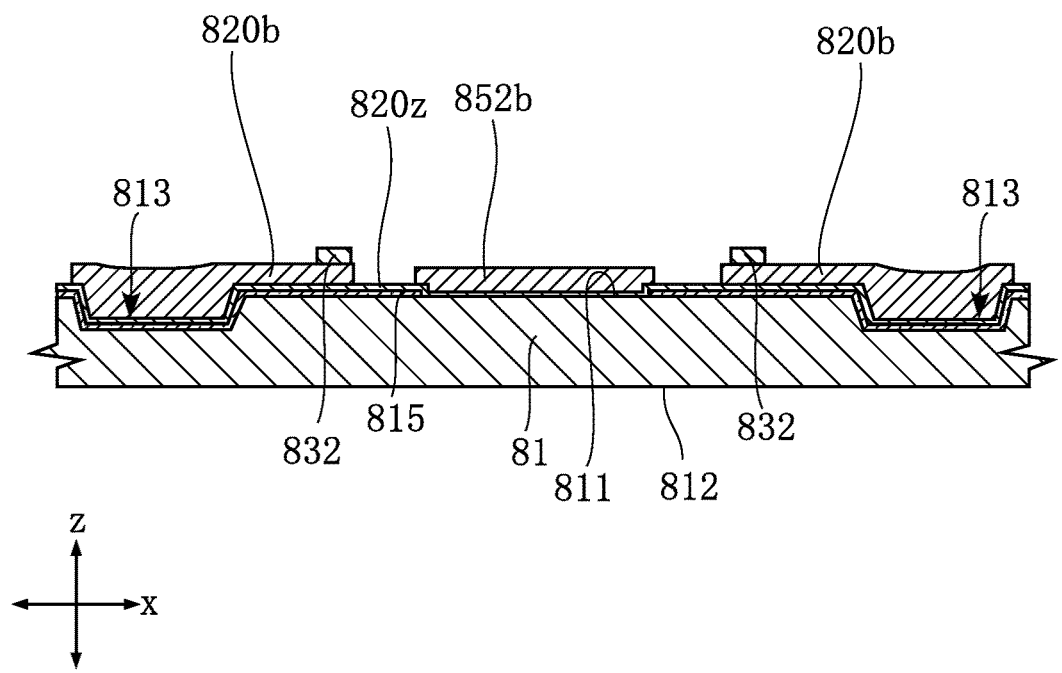
FIG. 32 is a sectional view showing a step of a method for manufacturing the semiconductor device shown in FIG. 29.

Next, as shown in FIG. 32, an insulating layer 815, an underlying layer 820z, plating layers 820b and 852b and bonding layers 832 are formed. These layers are formed in a manner similar to the first embodiment. Note that, in forming the plating layers 820b and 852b in the present embodiment, a plating solution to which an inhibitor and an accelerator are added is used so that metal deposition on the underlying layer 820z proceeds faster in the recesses 813 than on the front surface 811. As a result, the plating layer 820b has a larger thickness in the recesses 813 than on the front surface 811. The thicker portions of the plating layer 820b in the recesses 813 are to become the through conductors 24 of the semiconductor device A30.

Figure 33:
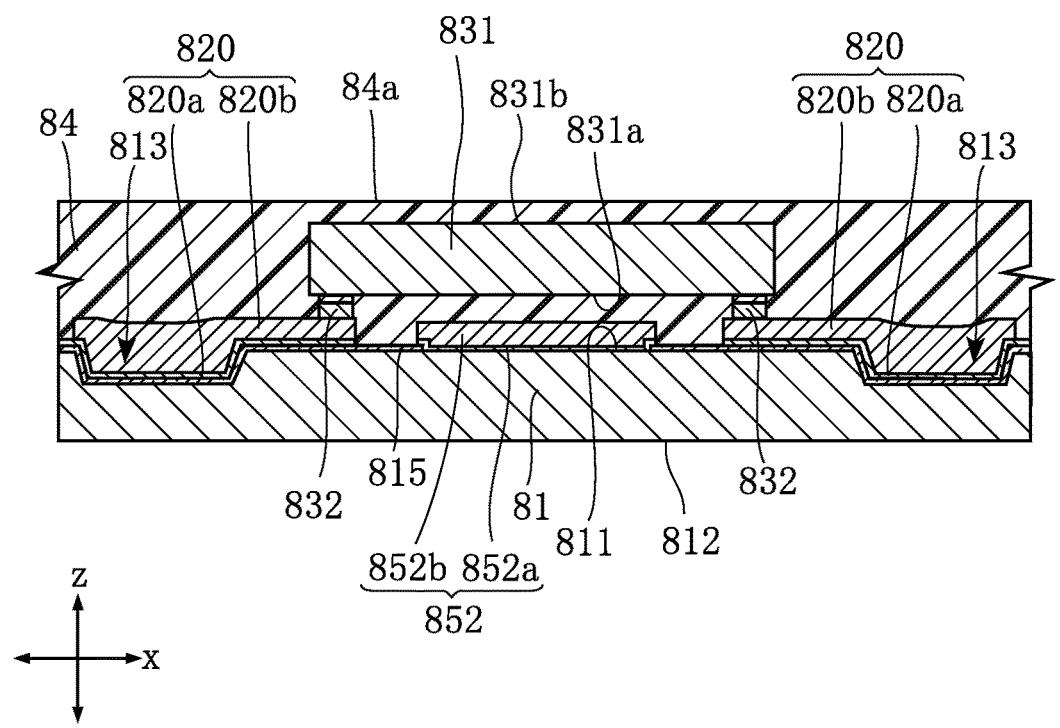
FIG. 33 is a sectional view showing a step of a method for manufacturing the semiconductor device shown in FIG. 29.

Next, as shown in FIG. 33, after unnecessary portions of the underlying layer 820z, i.e., the portions that are not covered with the plating layers 820b and 852b are removed, the semiconductor element 831 is mounted to the base 81, and the sealing resin 84 is formed. These steps are performed in a manner similar to the first embodiment.

Figure 34:
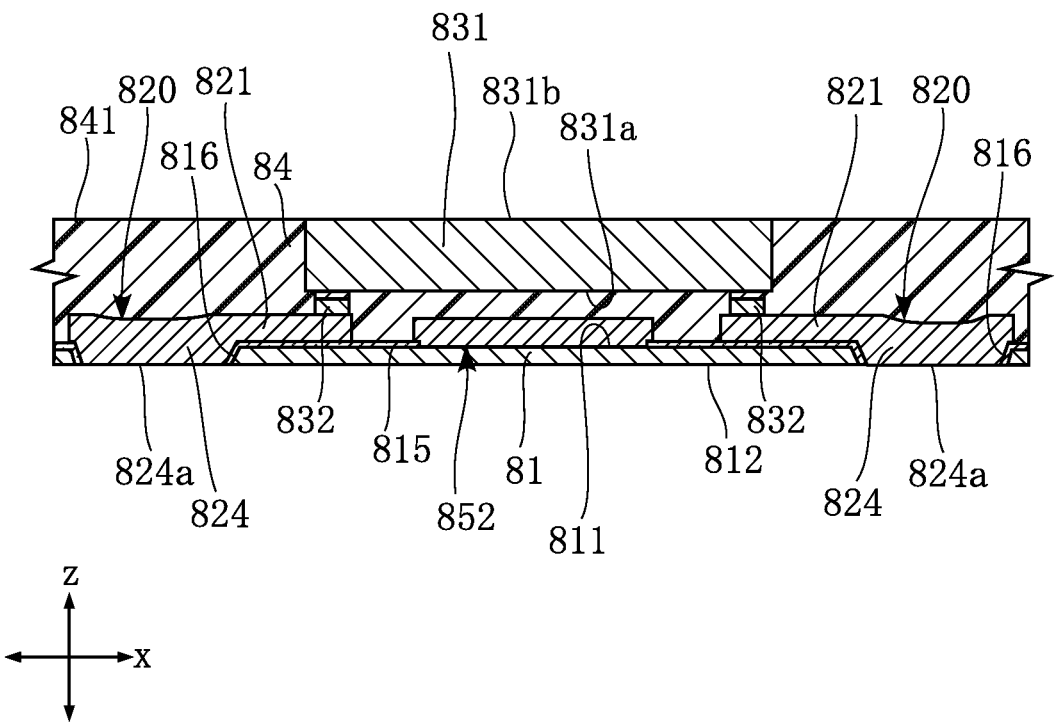
FIG. 34 is a sectional view showing a step of a method for manufacturing the semiconductor device shown in FIG. 29.

Next, as shown in FIG. 34, portions of the sealing resin 84 and base 81 are removed by mechanical grinding for example. Note that, in FIGS. 34 and 35, the underlying layer 820a and the plating layer 820b are collectively denoted as the wiring portion 820, and the underlying layer 852a and the plating layer 852b as the second heat dissipation layer 852. In this step, a portion of the sealing resin 84 is removed by grinding from the front surface 84a (the upper side in the figures) so that the semiconductor element 831 is exposed. This grinding makes the element front surface 831a of the semiconductor element 831 and the resin front surface 841 of the sealing resin 84 both flat and flush with each other.

Also, a portion of the base 81 is removed by grinding from the back surface 812 (the lower side in the figures) so that the through-holes 816 and the through conductors 824 are formed. In this step, grinding is performed until the dimension of the entirety in the thickness direction z (from the back surface 812 to the upper surface of the sealing resin 84) becomes a desired dimension (e.g. about 200 to 300 µm). As a result of this grinding step, the through conductors 824 have exposed surfaces 824a exposed from the back surface 812 of the base 81. The recesses 813 become the through-holes 816 as a result of removal of their bottom portions by grinding. In the present embodiment, by the grounding, the recesses 813 having a depth of about 50 to 80 µm become the through-holes 816 having a depth corresponding to the thickness of the base 81 (about 30 to 50 µm). Namely, the through conductors 824 are also ground off by about 20 to 30 µm. The exposed surfaces 824a of the through conductors 824 and the reverse surface 812 of the base 81 are all flat and flush with each other.

Figure 35:
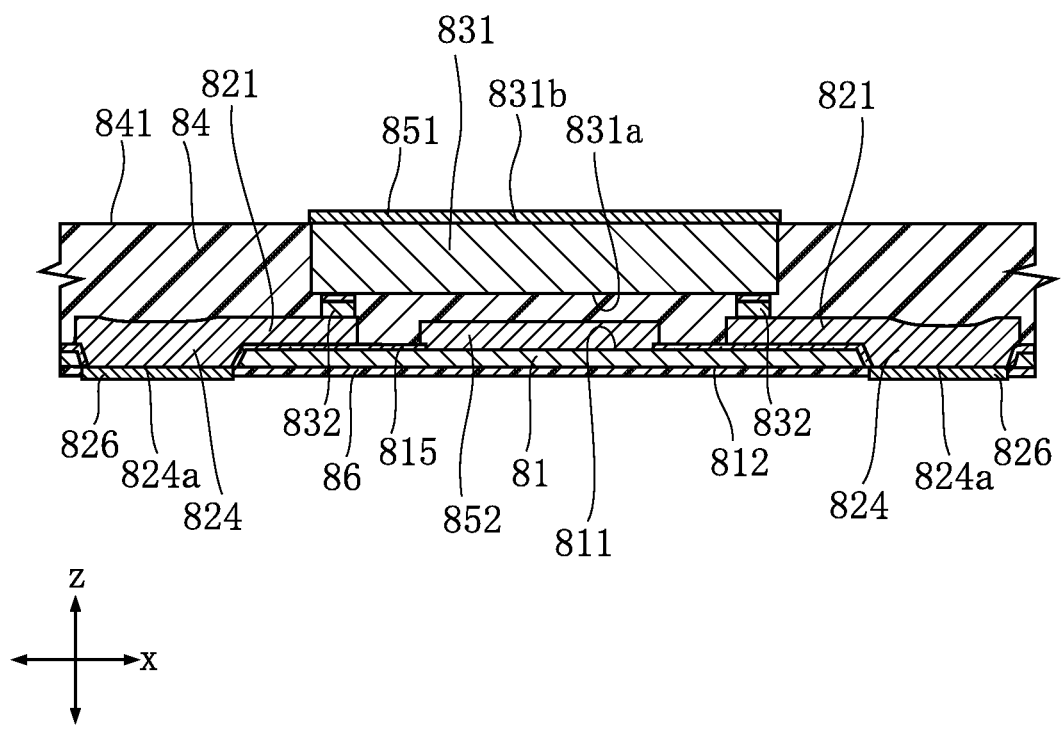
FIG. 35 is a sectional view showing a step of a method for manufacturing the semiconductor device shown in FIG. 29.

Next, as shown in FIG. 35, a resin film 86 is formed to cover the back surface 812 of the base 81. The resin film 86 may have openings or cutouts that surround entirely or partially the exposed surfaces 824a of the through conductors 824 so that the exposed surfaces 824 are not covered with the resin film 86. Next, as shown in FIG. 35, electrode pads 826 are formed on the exposed surfaces 824a of the through conductors 824 through the openings of the resin film 86. Further, the first heat dissipation layer 851 is formed on the element back surface 831b of the semiconductor element 831.

Thereafter, as with the first embodiment, the base 81 and the sealing resin 84 are cut along the first direction x and the second direction y by blade dicing for division into pieces corresponding to a plurality of semiconductor devices A30. Thus, the manufacturing of the of semiconductor device A30 is completed.

The advantages of the semiconductor device A30 and method for manufacturing the semiconductor device A30 are described below.

As with the semiconductor devices A10 and A20, the semiconductor device A30 includes the first heat dissipation layer 51. Thus, as with the first and the second embodiments, heat generated at the semiconductor element 31 is dissipated to the outside from the element back surface 312. This provides the same advantage as the first embodiment.

Also, as with the semiconductor devices A10 and A20, the semiconductor device A30 includes the second heat dissipation layer 52. Thus, as with the first embodiment, the semiconductor device A30 dissipates the heat generated at the semiconductor element 31 not only from the element back surface 312 through the first heat dissipation layer 51 but also from the element front surface 311 through the second heat dissipation layer 52. This also provides the same advantage as the first embodiment.

Figure 36:
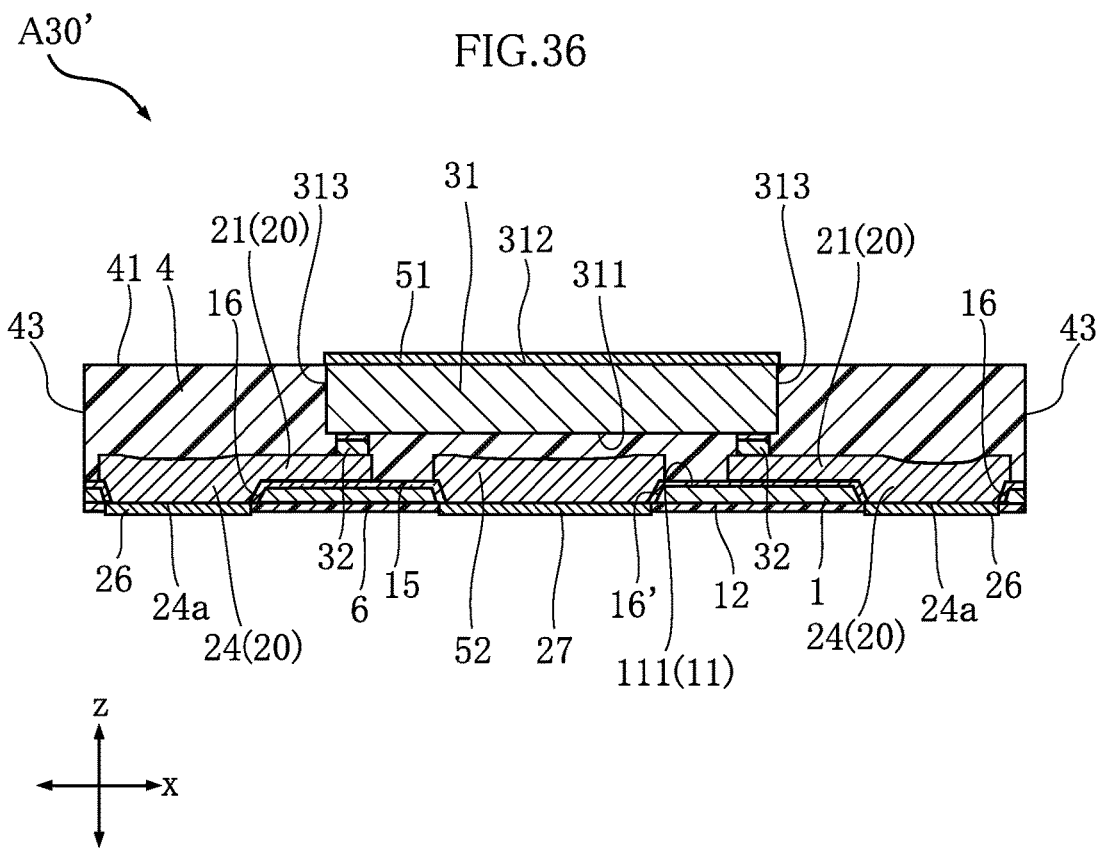
FIG. 36 is a sectional view of a semiconductor device according to a variation of the third embodiment.

Though not described, the parts or elements of the semiconductor device A30 or the steps of the manufacturing method that are the same as those of the first or the second embodiment provide the same advantages as the first or the second embodiment. Although the second heat dissipation layer 52 is formed on the substrate 1 in the third embodiment, the arrangement of the second heat dissipation layer 52 is not limited to this. For example, the second heat dissipation layer 52 may be formed so as to penetrate the substrate 1. FIG. 36 shows a semiconductor device A30' according to such a variation. Note that FIG. 30 is a sectional view corresponding to FIG. 30.

As a difference from the substrate 1 of the semiconductor device A30, the substrate 1 of the semiconductor device A30' further includes a through-hole 16'. The through-hole 16' overlaps with the semiconductor element 31 as viewed in plan. The through-hole 16' is rectangular as viewed in plan. The through-hole 16' is formed in a manner similar to the through-holes 16. The through-hole 16' may be formed simultaneously with the through-holes 16 or may be formed at a different timing. Note that the number and shape of the through-hole 16' are not limited. As shown in FIG. 36, the insulating layer 15 is formed also on the inner surface of the through-hole 16'.

As shown in FIG. 36, the second heat dissipation layer 52 of the semiconductor device A30' is formed such that a portion of the second heat dissipation layer 52 fills the through-hole 16'. The second heat dissipation layer 52 is exposed from the substrate front surface 11 and the substrate back surface 12 of the substrate 1. The surface of the second heat dissipation layer 52 exposed from the substrate back surface 12 is formed with a metal film 27. The metal film 27 may be made of the same material as the electrode pads 26. That is, the metal film 27 may be made up of a Ni layer formed on the second heat dissipation layer 52, a Pd layer laminated on the Ni layer and a Au layer laminated on the Pd layer. The Au layer is exposed to the outside. The metal film 27 is formed by electroless plating as with the electrode pads 26. In this variation, the resin film 6 (86) has an opening to allow the metal film 27 to be formed on the back surface of the second heat dissipation layer 52. Note that a resin film 6 may be formed instead of the metal film 27.

The semiconductor device A30' having the above-described configuration has the same advantages as those of the semiconductor device A30. In the semiconductor device A30', the second heat dissipation layer 52 penetrates the substrate 1, as described above. The second heat dissipation layer 52 is made of a metal (mainly Cu) and hence has a higher thermal conductivity than the substrate 1 made of Si. Thus, the semiconductor device A30' dissipates heat from the semiconductor element 31 more efficiently to the outside than the semiconductor device A30.

Although the through-hole 16' is added to the configuration of the semiconductor device A30 in the above-described variation, the through-hole 16' may instead be added to the configuration of the semiconductor device A10 or A20 so that a part of the second heat dissipation layer 52 of the semiconductor device A10 or A20 fills the through-hole 16'. That is, the second heat dissipation layer 52 of the semiconductor device A10 or A20 may penetrate the substrate 1. In that case, as with the semiconductor device A30', the inner surface of the through-hole 16' of the semiconductor device A10 or A20 may be inclined or may not be inclined with respect to the thickness direction z. Note that the method for forming the through-hole 16' is not limited.

Although the semiconductor devices A10, A20 and A30 in the first through the third embodiments include the second heat dissipation layer 52, the second heat dissipation layer 52 may be dispensed with. Specifically, a semiconductor device that does not include the second heat dissipation layer 52 may be obtained by forming the resist layer 802 also at the portion where the plating layer 852b is formed in the plating layer forming step described with reference to FIGS. 9 and 10.

Figure 37:
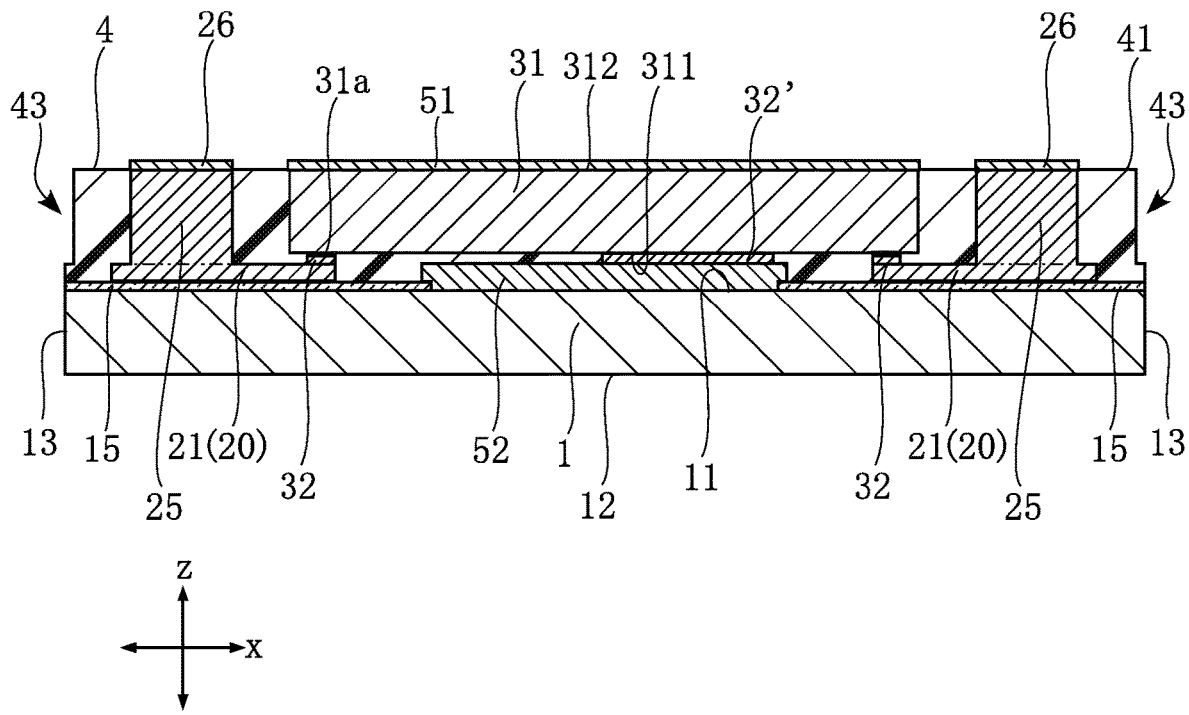
FIG. 37 is a sectional view of a semiconductor device according to a variation.

In the semiconductor devices A10, A20 and A30 of the first through the third embodiments, the semiconductor element 31 and the second heat dissipation layer 52 are spaced apart from each other, and the gap between the semiconductor element 31 and the second heat dissipation layer 52 is filled with the sealing resin 4. However, the present disclosure is not limited to such a configuration. For example, the semiconductor element 31 and the second heat dissipation layer 52 may be bonded to each other with an electrically conductive material as in the variation described below. FIG. 37 is a sectional view corresponding to FIG. 2, showing such a variation. This figure shows an example in which the semiconductor element 31 and the second heat dissipation layer 52 are bonded to each other with the bonding layer 32', in the configuration of the semiconductor device A10. In this variation, the bonding layer 32' is made of the same material as that for the bonding layers 32. As shown in FIG. 37, the bonding layer 32' is formed to cover a portion of the surface of the second heat dissipation layer 52 (the upper surface in the figure) that faces the semiconductor element 31. Alternatively, the bonding layer 32' may be formed to cover the entirety of the surface facing the semiconductor element 31. The arrangement and shape of the bonding layer 32' are not limited to that shown in FIG. 37. According to this variation, heat generated at the semiconductor element 31 is conducted to the second heat dissipation layer 52 via the bonding layer 32'. The bonding layer 32', which is mainly composed of metal, has a higher thermal conductivity than the sealing resin 4. Thus, the semiconductor device according to this variation further enhances the heat dissipation efficiency. Note that, in the case where the semiconductor element 31 and the second heat dissipation layer 52 are bonded to each other with the bonding layer 32', the second heat dissipation layer 52 may be used as an internal wiring portion. In this case, it is preferable that an insulating material is interposed between the second heat dissipation layer 52 and the substrate 1.

Although the semiconductor devices A10, A20 and A30 in the first through the third embodiments each include a single semiconductor element 31, the present disclosure is not limited to such a configuration. That is, the semiconductor device may include a plurality of semiconductor elements as in the variation described below. FIG. 38 is a sectional view corresponding to FIG. 2, showing such a variation. As shown in FIG. 38, the semiconductor device of this variation has a configuration obtained by adding a semiconductor element 33 to the configuration of the semiconductor device A10. The semiconductor element 33 in this variation may be a discrete semiconductor such as a diode. Alternatively, the semiconductor element 33 may not be a discrete semiconductor but may be an integrated circuit as with the semiconductor element 31. The semiconductor element 33 may be of a package type configured for surface-mounting. The configuration according to this variation allows the semiconductor device to have multiple functions.

The semiconductor device and the method for manufacturing the semiconductor device according to the present disclosure are not limited to the foregoing embodiments. The specific configuration of each part of the semiconductor device and each step of the manufacturing method according to the present disclosure may be varied in many ways.

The invention claimed is:

1. A semiconductor device comprising:
 a semiconductor element including an element front surface and an element back surface that are opposite to each other in a thickness direction;
 a wiring portion electrically connected to the semiconductor element;
 an electrode pad electrically connected to the wiring portion;
 a sealing resin that covers a portion of the semiconductor element;
 a first heat dissipation layer that is held in direct contact with the element back surface and exposed from the sealing resin;
 a semiconductor substrate supporting the semiconductor element; and
 a bonding layer electrically connecting the semiconductor element to the wiring portion, the bonding layer being disposed between the semiconductor element and the semiconductor substrate,
 wherein the semiconductor element overlaps with the first heat dissipation layer as viewed in the thickness direction, and
 the first heat dissipation layer and the electrode pad are disposed on a common plane.

2. The semiconductor device according to claim 1, wherein the first heat dissipation layer and the electrode pad are made of a same material.

3. The semiconductor device according to claim 2, wherein the material comprises a Ni layer, a Pd layer and a Au layer.

4. The semiconductor device according to claim 2, wherein the electrode pad and the first heat dissipation layer are insulated from each other.

5. The semiconductor device according to claim 1, further comprising a second heat dissipation layer insulated from the wiring portion,
 wherein the second heat dissipation layer faces the element front surface and is spaced apart from the element front surface, and wherein at least a portion of the second heat dissipation layer overlaps with the semiconductor element as viewed in the thickness direction.

6. The semiconductor device according to claim 5, wherein the second heat dissipation layer and the wiring portion comprise an underlying layer and a plating layer.

7. The semiconductor device according to claim 6, wherein the underlying layer comprises a Ti layer and a Cu layer, and the plating layer is made of Cu.

8. The semiconductor device according to claim 1, further comprising an insulating layer, wherein the wiring portion is formed on the semiconductor substrate, and the insulating layer insulates the semiconductor substrate and the wiring portion from each other.

9. The semiconductor device according to claim 5, further comprising an insulating layer, wherein the wiring portion is formed on the semiconductor substrate, and the insulating layer insulates the semiconductor substrate and the wiring portion from each other,
 the semiconductor substrate has a mounting surface to which the semiconductor element is mounted, the mounting surface including a covered region at which the insulating layer is formed and an exposed region exposed from the insulating layer,
 the second heat dissipation layer is held in contact with at least a portion of the exposed region of the mounting surface.

10. The semiconductor device according to claim 8, wherein the semiconductor substrate comprises Si.

11. The semiconductor device according to claim 1, further comprising a columnar portion that is electrically conductive and projects from the wiring portion in the thickness direction, wherein the electrode pad is held in contact with the columnar portion.

12. The semiconductor device according to claim 11, wherein the columnar portion has a top surface facing in a direction in which the element back surface faces, the top surface being exposed from the sealing resin, the sealing resin has a resin front surface facing in the direction in which the element back surface faces, and the top surface and the resin front surface are flush with the element back surface.

13. The semiconductor device according to claim 12, wherein the top surface is covered with the electrode pad, and the electrode pad and the first heat dissipation layer coincide in position with each other in the thickness direction.

14. The semiconductor device according to claim 1, wherein the first heat dissipation layer and the electrode pad have a same thickness.

\* \* \* \* \*